(12) United States Patent
Lee et al.

(10) Patent No.: US 8,882,921 B2
(45) Date of Patent: Nov. 11, 2014

(54) THIN FILM DEPOSITION APPARATUS

(75) Inventors: Choong-Ho Lee, Yongin (KR);
Jung-Min Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 740 days.

(21) Appl. No.: 12/795,001

(22) Filed: Jun. 7, 2010

(65) Prior Publication Data

US 2010/0310768 A1 Dec. 9, 2010

(30) Foreign Application Priority Data

Jun. 8, 2009 (KR) .................. 10-2009-0050529
Feb. 3, 2010 (KR) .................. 10-2010-0010136

(51) Int. Cl.
*C23C 16/00* (2006.01)
*C23F 1/00* (2006.01)
*H01L 21/306* (2006.01)

(52) U.S. Cl.
USPC ........ 118/726; 118/727; 118/720; 156/345.3; 156/345.19

(58) Field of Classification Search
USPC .......... 118/726, 727, 720; 156/345.3, 345.19
See application file for complete search history.

(56) References Cited

U.S. PATENT DOCUMENTS

| 4,687,939 A | 8/1987 | Miyauchi et al. |
|---|---|---|
| 4,901,667 A | 2/1990 | Suzuki et al. |
| 5,742,129 A | 4/1998 | Nagayama et al. |
| 6,045,671 A | 4/2000 | Wu et al. |
| 6,091,195 A | 7/2000 | Forrest et al. |
| 6,274,198 B1 | 8/2001 | Dautartas |
| 6,280,821 B1 | 8/2001 | Kadunce et al. |
| 6,371,451 B1 | 4/2002 | Choi |
| 6,579,422 B1 | 6/2003 | Kakinuma |
| 6,749,906 B2 | 6/2004 | Van Slyke |
| 6,878,209 B2 | 4/2005 | Himeshima et al. |
| 6,946,783 B2 | 9/2005 | Kim |

(Continued)

FOREIGN PATENT DOCUMENTS

| EP | 1 413 644 | 4/2004 |
|---|---|---|
| EP | 1 418 250 | 5/2004 |

(Continued)

OTHER PUBLICATIONS

KIPO Registration Determination Certificate dated Jan. 13, 2012, for Korean patent application 10-2009-0056529, 5 pages.

(Continued)

*Primary Examiner* — Keath Chen
(74) *Attorney, Agent, or Firm* — Christie, Parker & Hale, LLP

(57) ABSTRACT

A thin film deposition apparatus capable of forming a precise deposition pattern on a large substrate includes a deposition source; a first nozzle disposed at a side of the deposition source having a plurality of first slits; a second nozzle disposed opposite to the first nozzle having a plurality of second slits; and a second nozzle frame bound to the second nozzle so as to support the second nozzle. The second nozzle frame includes two first frame portions spaced apart from each other and disposed in a direction in which the plurality of second slits are arranged, and two second frame portions each connecting the two first frame portions to each other, wherein the second frame portions are curved in the direction in which the plurality of second slits are arranged, so as to form arches.

47 Claims, 15 Drawing Sheets

(56) References Cited

U.S. PATENT DOCUMENTS

| | | |
|---|---|---|
| 7,006,202 B2 | 2/2006 | Byun et al. |
| 8,188,476 B2 | 5/2012 | Takagi et al. |
| 8,193,011 B2 | 6/2012 | Kang et al. |
| 2001/0006827 A1 | 7/2001 | Yamazaki et al. |
| 2001/0019807 A1 | 9/2001 | Yamada et al. |
| 2001/0026638 A1 | 10/2001 | Sangu et al. |
| 2002/0017245 A1 | 2/2002 | Tsubaki et al. |
| 2002/0076847 A1 | 6/2002 | Yamada et al. |
| 2002/0168577 A1 | 11/2002 | Yoon |
| 2003/0101932 A1 | 6/2003 | Kang |
| 2003/0101937 A1 | 6/2003 | Van Slyke et al. |
| 2003/0118950 A1 | 6/2003 | Chao et al. |
| 2003/0168013 A1 | 9/2003 | Freeman et al. |
| 2003/0221614 A1 | 12/2003 | Kang et al. |
| 2003/0221620 A1 | 12/2003 | Yamazaki |
| 2003/0232563 A1 | 12/2003 | Kamiyama et al. |
| 2004/0029028 A1 | 2/2004 | Shimizu |
| 2004/0056244 A1 | 3/2004 | Marcus et al. |
| 2004/0086639 A1 | 5/2004 | Grantham et al. |
| 2004/0115338 A1* | 6/2004 | Yoneda ............. 427/66 |
| 2004/0115342 A1 | 6/2004 | Shigemura |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0183435 A1 | 9/2004 | Ohshita |
| 2004/0194702 A1 | 10/2004 | Sasaki et al. |
| 2004/0195530 A1 | 10/2004 | Kwak et al. |
| 2004/0216673 A1 | 11/2004 | Sakata et al. |
| 2005/0016461 A1 | 1/2005 | Klug et al. |
| 2005/0031836 A1 | 2/2005 | Hirai |
| 2005/0037136 A1 | 2/2005 | Yamamoto |
| 2005/0072361 A1* | 4/2005 | Yang et al. ............. 118/726 |
| 2005/0110400 A1 | 5/2005 | Nakamura |
| 2005/0129489 A1 | 6/2005 | Quan et al. |
| 2005/0153472 A1 | 7/2005 | Yotsuya |
| 2005/0166842 A1 | 8/2005 | Sakamoto |
| 2005/0229848 A1 | 10/2005 | Shinriki et al. |
| 2005/0263074 A1 | 12/2005 | Masuda et al. |
| 2006/0011136 A1 | 1/2006 | Yamazaki et al. |
| 2006/0022590 A1 | 2/2006 | Aziz et al. |
| 2006/0090705 A1 | 5/2006 | Kim |
| 2006/0110544 A1 | 5/2006 | Kim et al. |
| 2006/0113907 A1 | 6/2006 | Im et al. |
| 2006/0144325 A1 | 7/2006 | Jung et al. |
| 2006/0152641 A1 | 7/2006 | Brody |
| 2006/0174829 A1 | 8/2006 | An et al. |
| 2006/0205101 A1 | 9/2006 | Lee et al. |
| 2006/0272572 A1 | 12/2006 | Uematsu et al. |
| 2007/0022955 A1 | 2/2007 | Bender et al. |
| 2007/0054044 A1 | 3/2007 | Shimosaki et al. |
| 2007/0077358 A1 | 4/2007 | Jeong et al. |
| 2007/0148337 A1 | 6/2007 | Nichols et al. |
| 2007/0157879 A1 | 7/2007 | Yotsuya |
| 2007/0163497 A1 | 7/2007 | Grace et al. |
| 2007/0178708 A1 | 8/2007 | Ukigaya |
| 2007/0231460 A1 | 10/2007 | Ukigaya |
| 2008/0018236 A1 | 1/2008 | Arai et al. |
| 2008/0100201 A1 | 5/2008 | Wei et al. |
| 2008/0115729 A1 | 5/2008 | Oda et al. |
| 2008/0129194 A1 | 6/2008 | Abe et al. |
| 2008/0131587 A1 | 6/2008 | Boroson et al. |
| 2008/0145521 A1 | 6/2008 | Guo et al. |
| 2008/0174235 A1 | 7/2008 | Kim et al. |
| 2008/0216741 A1 | 9/2008 | Ling et al. |
| 2008/0238294 A1 | 10/2008 | Xu et al. |
| 2009/0017192 A1 | 1/2009 | Matsuura |
| 2009/0220691 A1 | 9/2009 | Kim |
| 2009/0229524 A1 | 9/2009 | Kim et al. |
| 2009/0232976 A1 | 9/2009 | Yoon et al. |
| 2009/0277386 A1 | 11/2009 | Takagi et al. |
| 2010/0001301 A1 | 1/2010 | Karg et al. |
| 2010/0055810 A1 | 3/2010 | Sung et al. |
| 2010/0192856 A1 | 8/2010 | Sung et al. |
| 2010/0196607 A1 | 8/2010 | Carlson et al. |
| 2010/0271602 A1* | 10/2010 | Hanazaki ............. 355/30 |
| 2010/0297348 A1 | 11/2010 | Lee et al. |
| 2010/0297349 A1 | 11/2010 | Lee et al. |
| 2010/0330265 A1 | 12/2010 | Lee et al. |
| 2010/0330712 A1 | 12/2010 | Lee et al. |
| 2011/0033619 A1 | 2/2011 | Lee et al. |
| 2011/0033621 A1 | 2/2011 | Lee et al. |
| 2011/0048320 A1 | 3/2011 | Choi et al. |
| 2011/0052791 A1 | 3/2011 | Jo et al. |
| 2011/0052795 A1 | 3/2011 | Choi et al. |
| 2011/0053296 A1 | 3/2011 | Lee et al. |
| 2011/0220019 A1 | 9/2011 | Lee et al. |
| 2012/0009328 A1 | 1/2012 | Ryu et al. |
| 2012/0313251 A1 | 12/2012 | Kato |

FOREIGN PATENT DOCUMENTS

| | | |
|---|---|---|
| EP | 1 518 940 | 3/2005 |
| JP | 57-194252 | 11/1982 |
| JP | 4-272170 | 9/1992 |
| JP | 05-230628 | 9/1993 |
| JP | 08-027568 | 1/1996 |
| JP | 09-095776 | 4/1997 |
| JP | 2000-68054 | 3/2000 |
| JP | 2001-52862 | 2/2001 |
| JP | 2001-93667 | 4/2001 |
| JP | 2002-075638 | 3/2002 |
| JP | 2002-175878 | 6/2002 |
| JP | 2003-3250 | 1/2003 |
| JP | 2003-77662 | 3/2003 |
| JP | 2003-157973 | 5/2003 |
| JP | 2003-297562 | 10/2003 |
| JP | 2003-197531 | 11/2003 |
| JP | 2003-321767 | 11/2003 |
| JP | 2004-035964 | 2/2004 |
| JP | 2004-43898 | 2/2004 |
| JP | 2004-076150 | 3/2004 |
| JP | 2004-103269 | 4/2004 |
| JP | 2004-103341 | 4/2004 |
| JP | 2004-137583 | 5/2004 |
| JP | 2004-169169 | 6/2004 |
| JP | 2004-199919 | 7/2004 |
| JP | 2004-349101 | 12/2004 |
| JP | 2005-44592 | 2/2005 |
| JP | 2005-122980 | 5/2005 |
| JP | 2005-165015 | 6/2005 |
| JP | 2005-174843 | 6/2005 |
| JP | 2005-206939 | 8/2005 |
| JP | 2005-235568 | 9/2005 |
| JP | 2005-293968 | 10/2005 |
| JP | 2005-296737 | 10/2005 |
| JP | 2006-028583 | 2/2006 |
| JP | 2006-172930 | 6/2006 |
| JP | 2006-176809 | 7/2006 |
| JP | 2006-210038 | 8/2006 |
| JP | 2006-275433 | 10/2006 |
| JP | 2006-292955 | 10/2006 |
| JP | 2007-47293 | 2/2007 |
| JP | 2007-186740 | 7/2007 |
| JP | 2007-291506 | 11/2007 |
| JP | 2008-108628 | 5/2008 |
| JP | 2008-121098 | 5/2008 |
| JP | 2008-521165 | 6/2008 |
| JP | 2009-19243 | 1/2009 |
| JP | 2009-024208 | 2/2009 |
| JP | 2009-081165 | 4/2009 |
| JP | 2009-87910 | 4/2009 |
| JP | 2010-261081 | 11/2010 |
| KR | 10-0257219 | 2/2000 |
| KR | 10-2000-0019254 | 4/2000 |
| KR | 10-2000-0023929 | 5/2000 |
| KR | 10-2001-0024652 | 3/2001 |
| KR | 10-2001-0059939 | 7/2001 |
| KR | 10-2001-0092914 | 10/2001 |
| KR | 10-2001-0093666 | 10/2001 |
| KR | 20-0257218 Y1 | 12/2001 |
| KR | 10-2002-0000201 | 1/2002 |
| KR | 10-2002-0001555 | 1/2002 |
| KR | 10-2002-0050922 | 6/2002 |

(56) References Cited

FOREIGN PATENT DOCUMENTS

| KR | 10-2002-0090934 | 12/2002 |
|---|---|---|
| KR | 10-2003-0001745 | 1/2003 |
| KR | 10-2003-0034730 | 5/2003 |
| KR | 10-2003-0046090 | 6/2003 |
| KR | 2003-0069684 | 8/2003 |
| KR | 10-0405080 | 10/2003 |
| KR | 10-2003-0091947 | 12/2003 |
| KR | 10-2003-0093959 | 12/2003 |
| KR | 10-2003-0094033 | 12/2003 |
| KR | 10-2004-0014258 | 2/2004 |
| KR | 10-2004-0034537 | 4/2004 |
| KR | 10-2004-0050045 | 6/2004 |
| KR | 10-2004-0069281 | 8/2004 |
| KR | 10-2004-0084747 | 10/2004 |
| KR | 10-2004-0087142 | 10/2004 |
| KR | 10-0463212 | 12/2004 |
| KR | 10-2005-0062853 | 6/2005 |
| KR | 10-0520159 | 9/2005 |
| KR | 10-2006-0008602 | 1/2006 |
| KR | 10-2006-0018745 | 3/2006 |
| KR | 2006-0020050 | 3/2006 |
| KR | 10-2006-0056706 | 5/2006 |
| KR | 10-2006-0058459 | 5/2006 |
| KR | 2006-0049050 | 5/2006 |
| KR | 10-2006-0065978 | 6/2006 |
| KR | 10-2006-0073367 | 6/2006 |
| KR | 2006-0059068 | 6/2006 |
| KR | 10-2006-0080475 | 7/2006 |
| KR | 10-2006-0080481 | 7/2006 |
| KR | 10-2006-0080482 | 7/2006 |
| KR | 10-2006-0083510 | 7/2006 |
| KR | 10-2006-0092387 | 8/2006 |
| KR | 10-2006-0098755 | 9/2006 |
| KR | 10-2006-0104288 | 10/2006 |
| KR | 10-2006-0104675 | 10/2006 |
| KR | 10-2006-0104677 | 10/2006 |
| KR | 10-2006-0109627 | 10/2006 |
| KR | 10-0635903 B1 | 10/2006 |
| KR | 10-2006-0114462 | 11/2006 |
| KR | 10-0645719 B1 | 11/2006 |
| KR | 10-0646160 | 11/2006 |
| KR | 10-2006-0123944 | 12/2006 |
| KR | 10-0687007 | 2/2007 |
| KR | 10-2007-0025164 | 3/2007 |
| KR | 10-0696547 | 3/2007 |
| KR | 10-0696550 | 3/2007 |
| KR | 10-0697663 B1 | 3/2007 |
| KR | 10-0698033 | 3/2007 |
| KR | 10-0700466 | 3/2007 |
| KR | 10-2007-0035796 | 4/2007 |
| KR | 10-0711885 | 4/2007 |
| KR | 10-2007-0050793 | 5/2007 |
| KR | 10-0723627 | 5/2007 |
| KR | 10-0726132 | 6/2007 |
| KR | 10-0739309 B1 | 7/2007 |
| KR | 10-2007-0078713 | 8/2007 |
| KR | 10-2007-0080635 | 8/2007 |
| KR | 10-2007-0101842 | 10/2007 |
| KR | 10-2007-0105595 | 10/2007 |
| KR | 10-0768212 | 10/2007 |
| KR | 10-0770653 | 10/2007 |
| KR | 10-2007-0112668 | 11/2007 |
| KR | 10-0787457 B1 | 12/2007 |
| KR | 10-2008-0001184 | 1/2008 |
| KR | 10-2008-0003720 | 1/2008 |
| KR | 10-0797787 | 1/2008 |
| KR | 10-0800125 | 1/2008 |
| KR | 10-0815265 | 3/2008 |
| KR | 10-2008-0036983 | 4/2008 |
| KR | 10-0823508 | 4/2008 |
| KR | 10-0827760 | 4/2008 |
| KR | 10-2008-0044775 | 5/2008 |
| KR | 10-2008-0048653 | 6/2008 |
| KR | 10-2008-0055124 | 6/2008 |
| KR | 10-0839380 | 6/2008 |
| KR | 10-2008-0060400 | 7/2008 |
| KR | 10-2008-0061132 | 7/2008 |
| KR | 10-2008-0061666 | 7/2008 |
| KR | 10-2008-0061774 | 7/2008 |
| KR | 10-2008-0062212 | 7/2008 |
| KR | 10-2008-0109559 | 12/2008 |
| KR | 10-2009-0038733 | 4/2009 |
| KR | 10-2009-0040618 | 4/2009 |
| KR | 10-2009-0052155 | 5/2009 |
| KR | 10-2009-0053417 | 5/2009 |
| KR | 10-2009-0066996 | 6/2009 |
| KR | 10-0908232 B1 | 7/2009 |
| KR | 10-2009-0093161 | 9/2009 |
| KR | 10-2009-0097453 | 9/2009 |
| KR | 10-2010-0000128 | 1/2010 |
| KR | 10-2010-0000129 | 1/2010 |
| KR | 10-2010-0026655 | 3/2010 |
| KR | 10-2010-0047796 | 5/2010 |
| KR | 10-2010-0090070 | 8/2010 |
| KR | 10-2010-0099806 | 9/2010 |
| KR | 10-2010-0126125 | 12/2010 |
| KR | 10-2011-0101767 | 9/2011 |
| KR | 10-2012-0006324 | 1/2012 |
| WO | WO 99/25894 A1 | 5/1999 |
| WO | WO 2008/004792 A1 | 1/2008 |

OTHER PUBLICATIONS

KIPO Office action dated Feb. 1, 2012, for Korean patent application 10-2010-0031848, 4 pages.
KIPO Registration Determination Certificate dated Sep. 28, 2011, for Korean Patent application 10-2009-0052357, 5 pages.
KIPO Registration Determination Certificate dated Nov. 25, 2011, for Korean Patent application 10-2010-0014277, 5 pages.
KIPO Office action dated Feb. 1, 2012, for Korean patent application 10-2010-0011196, 4 pages.
U.S. Appl. No. 13/031,756, filed Feb. 22, 2011, Yong Sup Choi et al., Samsung Mobile Display Co., Ltd.
KIPO Registration Determination Certificate dated Jul. 20, 2012, for Korean Patent application 10-2010-0003545, (5 pages).
KIPO Registration Determination Certificate dated Apr. 30, 2012, for Korean Patent application 10-2010-0066992, (5 pages).
Japanese Office action dated Aug. 21, 2012, for Japanese Patent application 2010-145075, (5 pages).
KIPO Office action dated Sep. 1, 2012, for Korean priority Patent application 10-2010-0010136, (5 pages).
KIPO Notice of Allowance dated Sep. 1, 2012, for Korean Patent application 10-2010-0013848, (5 pages).
KIPO Notice of Allowance dated Sep. 1, 2012, for Korean Patent application 10-2010-0009160, (5 pages).
English-language abstract of Korean Publication No. KR 10-2002-0034272.
English-language abstract of Korean Publication No. KR 10-2002-0056238.
English-language abstract of Korean Publication No. KR 10-2002-0088662.
English-language abstract of Korean Publication No. KR 10-2005-0045619.
English-language abstract of Korean Publication No. KR 10-2006-0126267.
English-language abstract of Korean Publication No. KR 10-2008-0038650.
U.S. Appl. No. 12/784,774, filed May 21, 2010, Choong-Ho Lee et al., Samsung Mobile Display Co., Ltd.
U.S. Appl. No. 13/014,225, filed Jan. 26, 2011, Jong-Won Hong et al., Samsung Mobile Display Co., Ltd.
U.S. Appl. No. 12/797,858, filed Jun. 10, 2010, Choong-Ho Lee et al., Samsung Mobile Display Co., Ltd.
U.S. Appl. No. 12/836,760, filed Jul. 15, 2010, Jong-Heon Kim, et al., Samsung Mobile Display Co., Ltd.
U.S. Appl. No. 12/784,804, filed May 21, 2010, Choong-Ho Lee, et al., Samsung Mobile Display Co., Ltd.
U.S. Appl. No. 12/849,193, filed Aug. 3, 2010, Ji-Sook Oh et al., Samsung Mobile Display Co., Ltd.

(56) References Cited

OTHER PUBLICATIONS

U.S. Appl. No. 12/979,193, filed Dec. 28, 2010, Hyun Sook Park et al., Samsung Mobile Display Co., Ltd.
U.S. Appl. No. 12/820,355, filed Jun. 22, 2010, Yong-Sup Choi et al., Samsung Mobile Display Co., Ltd.
U.S. Appl. No. 12/950,361, filed Nov. 19, 2010, Choong-Ho Lee, et al., Samsung Mobile Display Co., Ltd.
U.S. Appl. No. 12/795,896, filed Jun. 8, 2010, Jung-Min Lee, et al., Samsung Mobile Display Co., Ltd.
U.S. Appl. No. 12/856,942, filed Aug. 16, 2010, Yun-Mi Lee et al., Samsung Mobile Display Co., Ltd.
U.S. Appl. No. 12/814,816, filed Jun. 14, 2010, Jung-Min Lee et al., Samsung Mobile Display Co., Ltd.
U.S. Appl. No. 12/868,099, filed Aug. 25, 2010, Hee-Cheol Kang, et al., Samsung Mobile Display Co., Ltd.
U.S. Appl. No. 12/862,153, filed Aug. 24, 2010, Hee-Cheol Kang, et al., Samsung Mobile Display Co., Ltd.
U.S. Appl. No. 12/869,830, filed Aug. 27, 2010, Chang-Mog Jo, et al., Samsung Mobile Display Co., Ltd.
U.S. Appl. No. 12/849,092, filed Aug. 3, 2010, Choong-Ho Lee et al., Samsung Mobile Display Co., Ltd.
U.S. Appl. No. 12/873,556, filed Sep. 1, 2010, Young-Mook Choi, et al., Samsung Mobile Display Co., Ltd.
U.S. Appl. No. 12/873,689, filed Sep. 1, 2010, Young-Mook Choi, et al., Samsung Mobile Display Co., Ltd.
U.S. Appl. No. 12/815,673, filed Jun. 15, 2010, Jung-Min Lee, Samsung Mobile Display Co., Ltd.
U.S. Appl. No. 12/794,093, filed Jun. 4, 2010, Jung-Min Lee et al., Samsung Mobile Display Co., Ltd.
U.S. Appl. No. 12/862,125, filed Aug. 24, 2010, Jae-Kwang Ryu et al., Samsung Mobile Display Co., Ltd.
U.S. Appl. No. 12/813,786, filed Jun. 11, 2010, Choong-Ho Lee et al., Samsung Mobile Display Co., Ltd.
U.S. Appl. No. 12/820,270, filed Jun. 22, 2010, Jung-Min Lee et al., Samsung Mobile Display Co., Ltd.
U.S. Appl. No. 12/907,396, filed Oct. 19, 2010, Yong-Sup Choi, et al., Samsung Mobile Display Co., Ltd.
U.S. Appl. No. 12/987,569, filed Jan. 10, 2011, Yun-Mi Lee et al., Samsung Mobile Display Co., Ltd.
U.S. Appl. No. 12/984,289, filed Jan. 4, 2011, Jung-Yeong Kim et al., Samsung Mobile Display Co., Ltd.
Japanese Office action dated Sep. 4, 2012, for correspnding Japanese Patent application 2010-152846, (4 pages).
U.S. Office action dated Jul. 17, 2013, for cross reference U.S. Appl. No. 12/984,231, (18 pages).
Korean Patent Abstracts for Korean Publication 10-2007-0097218 dated Oct. 4, 2007, corresponding to Korean Patent 10-0768212 dated Oct. 18, 2007 listed above.
English machine translation of Japanese Publication 2004-349101 previously filed in an IDS dated Jan. 3, 2013, (10 pages).
Patent Abstracts of Japan, and English machine translation of Japanese Publication 2009-024208 listed above, (30 pages).
KIPO Office action dated Aug. 1, 2011 for Korean Patent application 10-2009-0074001, (3 pages).
KIPO Office action dated Feb. 1, 2012 for Korean Patent application 10-2010-0014272, (4 pages).
KIPO Office action dated Feb. 6, 2012 for Korean Patent application 10-2010-0021835, (4 pages).
KIPO Office action dated Apr. 2, 2012 for Korean Patent application 10-2010-0066993, (4 pages).
KIPO Notice of Allowance dated Aug. 24, 2012 for Korean Patent application 10-2010-0066993, (5 pages).
KIPO Notice of Allowance dated Sep. 1, 2012 for Korean Patent application 10-2010-0014276, (5 pages).
KIPO Office action dated Aug. 28, 2012 for Korean Patent application 10-2010-0014274, (5 pages).
KIPO Notice of Allowance dated Oct. 31, 2011 for Korean Patent application 10-2010-0014273, (5 pages).
KIPO Office action dated Feb. 6, 2012 for Korean Patent application 10-2010-0014274, (9 pages).
U.S. Office action dated Dec. 20, 2012 for cross reference U.S. Appl. No. 12/984,289, (20 pages).
U.S. Office action dated Feb. 26, 2013 for cross reference U.S. Appl. No. 12/794,093, (31 pages).
U.S. Office action dated Mar. 15, 2013 for cross reference U.S. Appl. No. 12/813,786, (33 pages).
U.S. Office action dated Mar. 19, 2013 for cross reference U.S. Appl. No. 13/194,759, (36 pages).
U.S. Office action dated Mar. 22, 2013 for cross reference U.S. Appl. No. 12/987,569, (12 pages).
U.S. Office action dated Mar. 18 2013 for cross reference U.S. Appl. No. 12/984,231, (29 pages).
U.S. Office action dated May 7 2013 for cross reference U.S. Appl. No. 12/820,270, (37 pages).
U.S. Office action dated Sep. 12, 2012 for cross reference U.S. Appl. No. 12/815,673, (26 pages).
U.S. Office action dated Dec. 17, 2012 for cross reference U.S. Appl. No. 12/873,556, (37 pages).
U.S. Office action dated Dec. 26, 2012 for cross reference U.S. Appl. No. 12/815,673, (21 pages).
U.S. Office action dated Jan. 25, 2013 for cross reference U.S. Appl. No. 13/015,357, (21 pages).
English machine translation of Japanese Publication 2004-349101 previously filed in an IDS dated Oct. 29, 2012, (10 pages).
U.S. Office action dated Jun. 11, 2013 for cross reference U.S. Appl. No. 12/862,125, (37 pages).
U.S. Office action dated Jun. 26, 2013 for cross reference U.S. Appl. No. 12/794,093, (20 pages).
U.S. Office action dated Aug. 13, 2013 for cross reference U.S. Appl. No. 13/194,759, (28 pages).
U.S. Office action dated Apr. 1, 2013 for cross reference U.S. Appl. No. 12/784,774, (44 pages).
U.S. Office action dated May 24 2013 for cross reference U.S. Appl. No. 12/849,092, (31 pages).
U.S. Office action dated Jul. 3, 2013 for cross reference U.S. Appl. No. 12/873,689, (48 pages).
U.S. Office action dated Oct. 11, 2013 for cross reference U.S. Appl. No. 12/907,396, (44 pages).
U.S. Office action dated Oct. 21, 2013 for cross reference U.S. Appl. No. 12/987,569, (14 pages).

* cited by examiner

THIN FILM DEPOSITION APPARATUS

CROSS-REFERENCE TO RELATED APPLICATIONS

This application claims the benefit of Korean Patent Application No. 10-2009-0050529, filed Jun. 8, 2009 and Korean Patent Application No. 10-2010-0010136, filed Feb. 3, 2010 in the Korean Intellectual Property Office, the disclosures of which are incorporated herein by reference.

BACKGROUND

1. Field

Aspects of the present invention relate to a thin film deposition apparatus, and more particularly, to a thin film deposition apparatus capable of forming a precise pattern on a large substrate.

2. Description of the Related Art

Organic light-emitting display devices have a larger viewing angle, better contrast characteristics, and a faster response rate than other display devices, and thus have drawn attention as a next-generation display device. An organic light-emitting display device may generally generate visual light when holes and electrons respectively injected from an anode electrode and a cathode electrode are recombined in an organic emission layer and thus light is emitted. However, it is difficult to achieve high light-emission efficiency with such a structure. Thus, organic layers, including an electron injection layer, an electron transport layer, a hole transport layer, a hole injection layer, etc., together with the organic emission layer are optionally additionally interposed between the anode and cathode electrodes.

The anode and cathode electrodes, the organic emission layer, and the organic layers of the organic light-emitting display devices may be formed using a variety of methods, one of which is a deposition method. When an organic light-emitting display device is manufactured using the deposition method, a fine metal mask (FMM) having the same pattern as a thin film to be formed is disposed to closely contact a substrate on which the thin film is to be formed. A thin film material is deposited over the FMM in order to form the thin film having the desired pattern.

However, it is difficult to form fine patterns of organic thin films such as an organic emission layer or organic layers. The light emission efficiency of red, green, and blue colors may vary according to features such as the fine patterns and the thicknesses of the organic thin films. Thus, it is difficult to improve light emission characteristics of organic light-emitting display devices.

Also, recently, there is higher demand for large-sized display devices, but it is difficult to pattern organic thin films on a large surface using a conventional thin film deposition apparatus. Thus, it is difficult to manufacture large-sized organic light-emitting display devices having satisfactory levels of driving voltage, current density, brightness, color purity, light emission efficiency, durability, etc.

SUMMARY

An aspect of the present invention provides a thin film deposition apparatus capable of forming a precise pattern on a large substrate.

According to an aspect of the present invention, there is provided a thin film deposition apparatus including a deposition source; a first nozzle disposed at a side of the deposition source and including a plurality of first slits; a second nozzle disposed opposite to the first nozzle and including a plurality of second slits; and a second nozzle frame bound to the second nozzle so as to support the second nozzle, and including two first frame portions spaced apart from each other and disposed in a direction in which the plurality of second slits are arranged, and two second frame portions each connecting the two first frame portions to each other, wherein the second frame portions are curved in the direction in which the plurality of second slits are arranged, so as to form arches.

According to an aspect of the present invention, both ends of each of the second frame portions may be connected to the first frame portions.

According to an aspect of the present invention, thicknesses of the both ends of each of the second frame portions may be greater than a thickness of a center of each of the second frame portions.

According to an aspect of the present invention, the two first frame portions may be parallel with each other.

According to an aspect of the present invention, the second frame portions may be convexly curved in a direction away from a center of the second nozzle frame.

According to an aspect of the present invention, each of the first frame portions may include a first surface disposed in a direction toward the second nozzle; and a second surface disposed in the direction toward the second nozzle and adjacent to the first surface. The first surface may be closer to the plurality of second slits of the second nozzle than the second surface. The first surface may be flat and the second surface is sloping.

According to an aspect of the present invention, the second surface may be curved with respect to the first surface.

According to an aspect of the present invention, the second surface may be sloping so as not to coincide with an extension line of the first surface.

According to an aspect of the present invention, the second nozzle and the second nozzle frame may be bound to each other using welding points formed on the second surface.

According to an aspect of the present invention, each of the first frame portions may include a third surface disposed in a direction away from the second nozzle; and a fourth surface disposed in the direction away from the second nozzle, to connect the third surface to the first surface, and the third surface may be flat and the fourth surface may be sloping.

According to an aspect of the present invention, the fourth surface may form an obtuse angle together with the third surface.

According to an aspect of the present invention, each of the first frame portions may include a third surface disposed in the direction away from the second nozzle, being adjacent to the second surface, and formed to be flat; and a fourth surface disposed in the direction away from the second nozzle, being adjacent to the third surface, and formed to have a step with respect to the third surface. The fourth surface may be closer to the plurality of second slits of the second nozzle than the third surface.

According to an aspect of the present invention, the fourth surface may be flat.

According to an aspect of the present invention, the thin film deposition apparatus may further include a first barrier wall assembly that includes a plurality of first barrier walls for partitioning a space between the first nozzle and the second nozzle.

According to an aspect of the present invention, the first slits and the second slits may be arranged in a first direction, and each of the plurality of first barrier walls may extend in a second direction that is substantially perpendicular to the first direction, in order to partition the space between the first nozzle and the second nozzle.

According to an aspect of the present invention, at least one of the first slits may be disposed between each two adjacent first barrier walls.

According to an aspect of the present invention, at least two of the second slits may be disposed between each two adjacent first barrier walls.

According to an aspect of the present invention, a number of second slits disposed between each two adjacent first barrier walls may be greater than a number of first slits disposed between each two adjacent first barrier walls.

According to an aspect of the present invention, the first barrier wall assembly may be detachable from the thin film deposition apparatus.

According to an aspect of the present invention, the first barrier wall assembly may be separated from the first nozzle.

According to an aspect of the present invention, the thin film deposition apparatus may further include a second barrier wall assembly that is disposed at a side of the first barrier wall assembly and includes a plurality of second barrier walls.

According to an aspect of the present invention, the first slits and the second slits may be arranged in a first direction.

According to an aspect of the present invention, each of the second barrier walls may extend in a second direction that is substantially perpendicular to the first direction, in order to partition the space between the first nozzle and the second nozzle.

According to an aspect of the present invention, the first barrier walls may be arranged to correspond to the second barrier walls.

According to an aspect of the present invention, each pair of the corresponding first and second barrier walls may be arranged on substantially the same plane.

According to an aspect of the present invention, thicknesses of the first barrier walls in the first direction may be greater than thicknesses of the second barrier walls.

According to an aspect of the present invention, the first barrier walls and the second barrier walls may be respectively arranged at equal intervals.

According to an aspect of the present invention, the first barrier walls may be separated from the second barrier walls by a predetermined distance.

According to an aspect of the present invention, the second barrier walls may be separated from the second nozzle by a predetermined distance.

According to an aspect of the present invention, the plurality of first slits may be formed in a first direction, the plurality of second slits may be formed in a second direction perpendicular to the first direction, the thin film deposition apparatus may perform deposition while moving relative to a deposition target in the first direction, and the deposition source, the first nozzle, and the second nozzle may be integrally formed with one another.

According to an aspect of the present invention, the deposition source, the first nozzle, and the second nozzle may be formed integrally with one another by being connected to each other via a connection member.

According to an aspect of the present invention, the connection member may guide movement of the deposition material contained in the deposition source.

According to an aspect of the present invention, the connection member may seal a space among the deposition source, the first nozzle, and the second nozzle.

According to an aspect of the present invention, the deposition material discharged from the thin film deposition apparatus may be continuously deposited on the deposition target while the deposition target or the thin film deposition apparatus is moved relative to each other in the first direction.

According to an aspect of the present invention, the plurality of first slits may be tilted at a predetermined angle.

According to an aspect of the present invention, the plurality of first slits may include first slits arranged in two rows in the first direction, and the first slits in the two rows may be tilted to face each other.

According to an aspect of the present invention, the plurality of first slits may include the first slits arranged in two rows in the first direction, the first slits arranged in one row may face an end at a second side of the second nozzle, and the first slits arranged in the other row may face an end at a first side of the second nozzle.

According to an aspect of the present invention, the second nozzle may be separated by a predetermined distance from a deposition target on which a deposition material vaporized in the deposition source is deposited.

According to an aspect of the present invention, a width of the second nozzle in a direction may be substantially equal to a width of the deposition target in the first direction.

According to an aspect of the present invention, a total number of the second slits may be greater than a total number of the first slits.

According to an aspect of the present invention, the first barrier wall assembly may further include a first cooling member.

According to an aspect of the present invention, the second barrier wall assembly may further include a second cooling member.

According to an aspect of the present invention, the thin film deposition apparatus may further include a radiation fin formed on the second nozzle frame.

According to an aspect of the present invention, the thin film deposition apparatus may further include a thermal shield disposed between the deposition source and the second nozzle frame.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
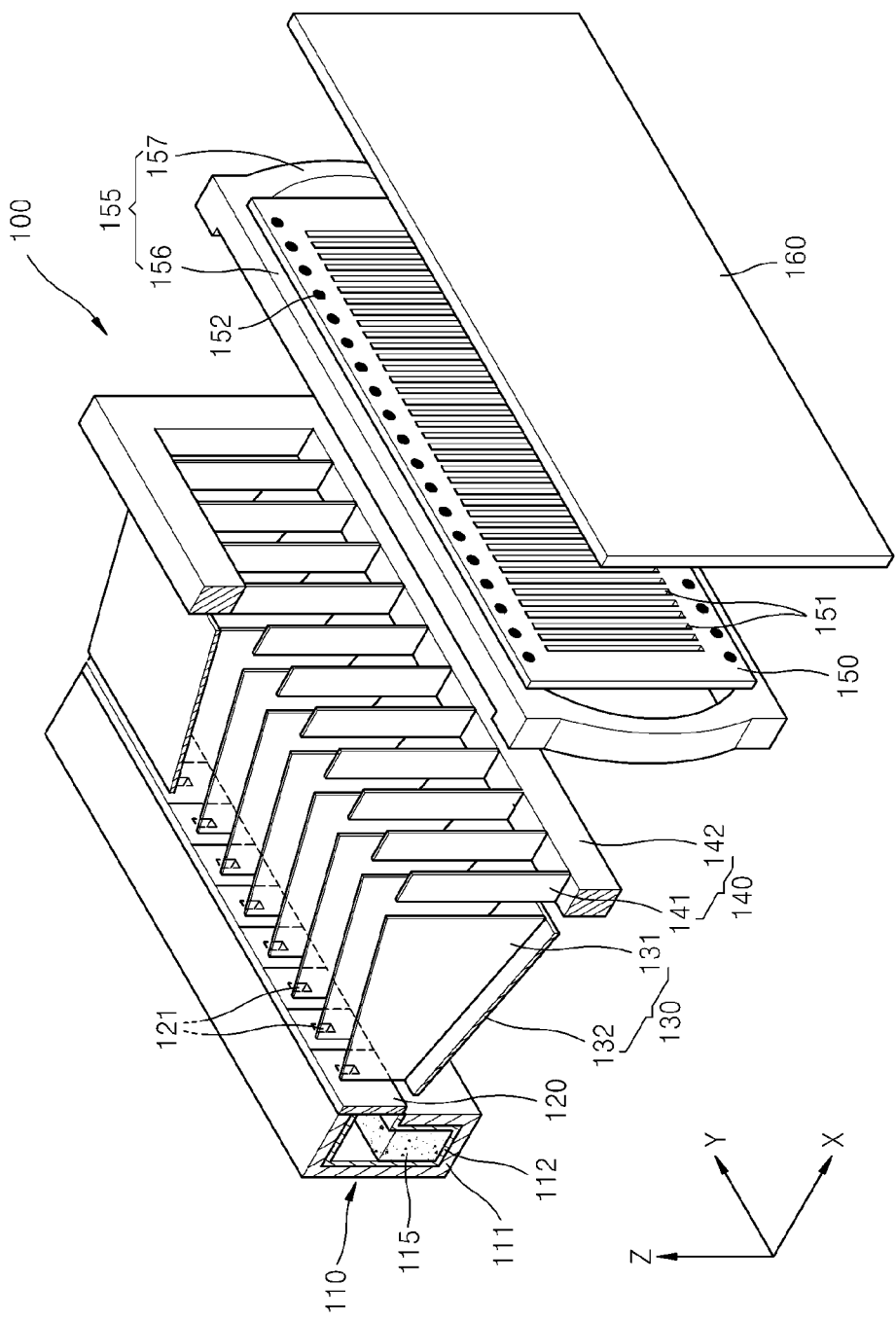
FIG. 1 is a schematic perspective view of a thin film deposition apparatus according to an embodiment of the present invention.
Figure 2:
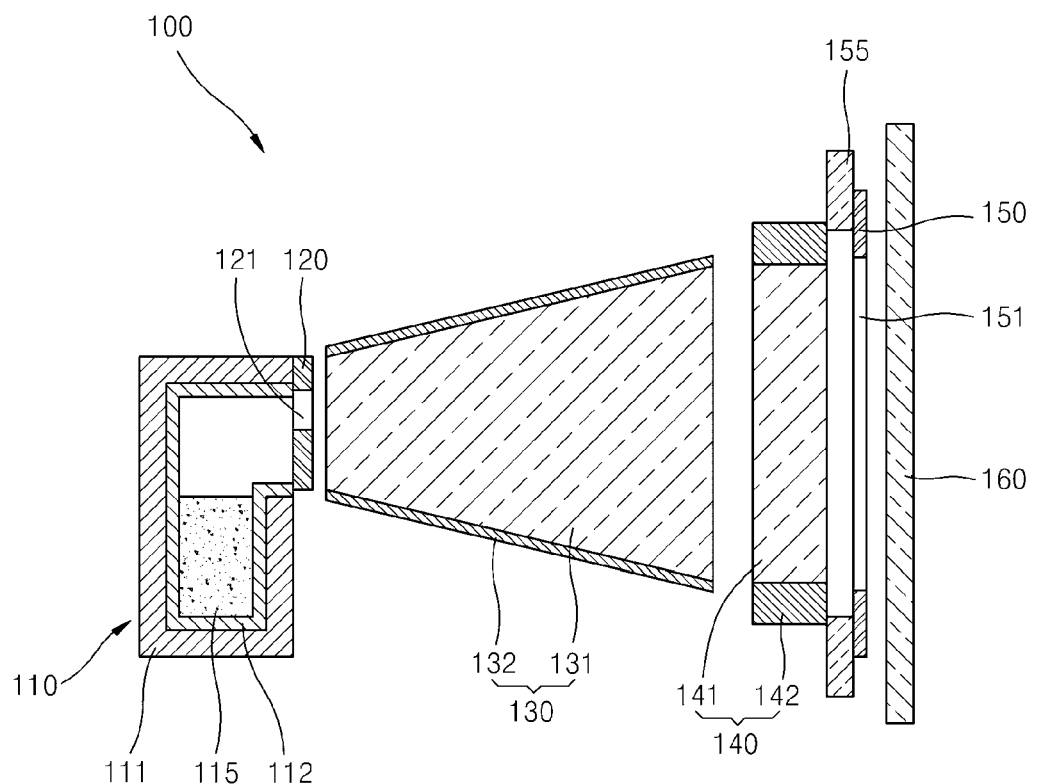
FIG. 2 is a schematic side view of the thin film deposition apparatus of FIG. 1.

Reference will now be made in detail to the present embodiments of the present invention, examples of which are illustrated in the accompanying drawings, wherein like reference numerals refer to the like elements throughout. The embodiments are described below in order to explain the present invention by referring to the figures. Moreover, it is to be understood that where is stated herein that one film or layer is "formed on" or "disposed on" a second layer or film, the first layer or film may be formed or disposed directly on the second layer or film or there may be intervening layers or films between the first layer or film and the second layer or film. Further, as used herein, the term "formed on" is used with the same meaning as "located on" or "disposed on" and is not meant to be limiting regarding any particular fabrication process FIG. 1 is a schematic perspective view of a thin film deposition apparatus 100 according to an embodiment of the present invention. FIG. 2 is a schematic side view of the thin film deposition apparatus 100, and FIG. 3 is a schematic plan view of the thin film deposition apparatus 100.

Figure 3:
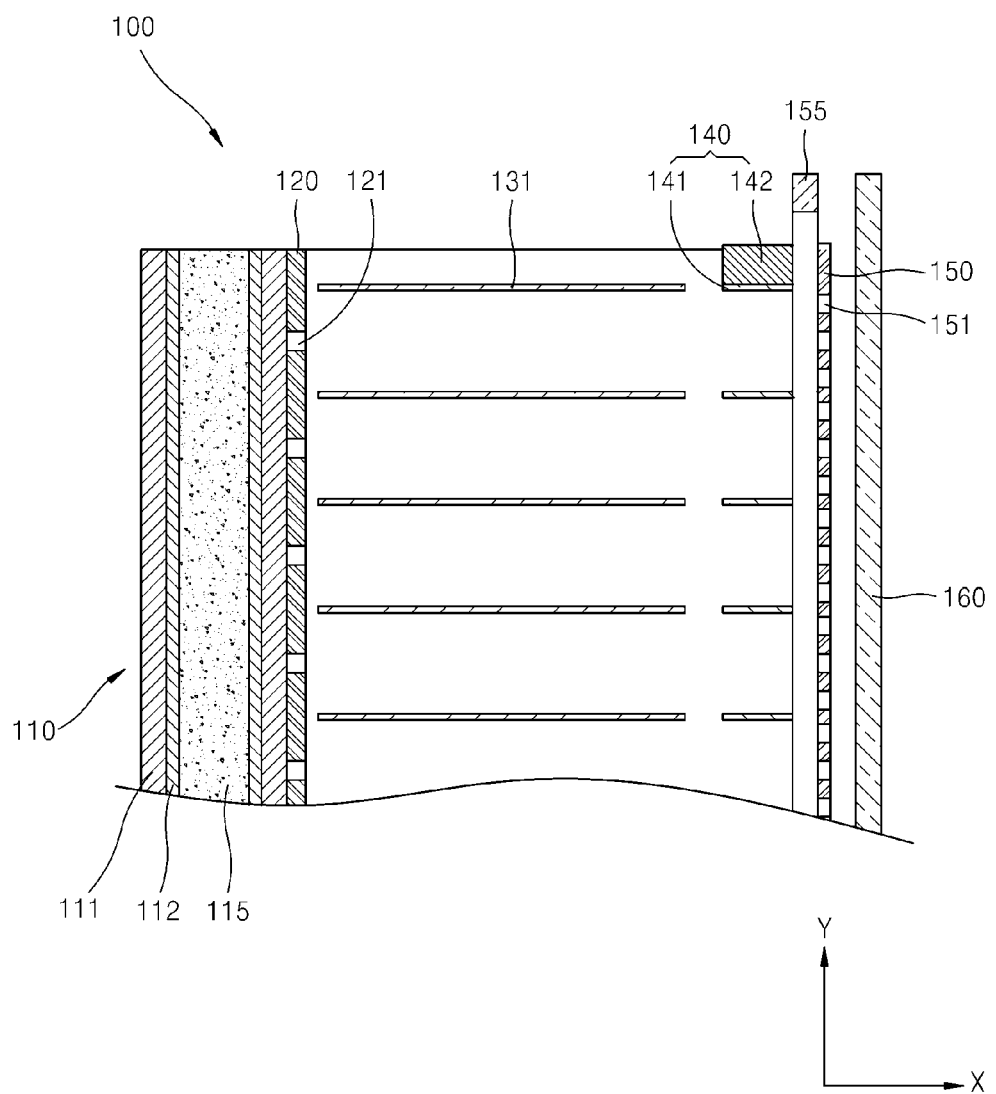
FIG. 3 is a schematic plan view of the thin film deposition apparatus of FIG. 1, according to an embodiment of the present invention.

Referring to FIGS. 1, 2 and 3, the thin film deposition apparatus 100 includes a deposition source 110, a first nozzle 120, a first barrier wall assembly 130, a second barrier wall assembly 140, a second nozzle 150, and a second nozzle frame 155 in order to deposit a deposition material 115 on a substrate 160. According to other aspects of the present invention, the thin film deposition apparatus 100 may include additional and/or different components, such as in the examples described below. The second barrier wall assembly 140 includes a plurality of second barrier walls 141 and a second barrier wall frame 142.

Although a chamber is not illustrated in FIGS. 1, 2 and 3 for convenience of explanation, all the components of the thin film deposition apparatus 100 may be disposed within a chamber that is maintained at an appropriate degree of vacuum. The chamber is maintained at an appropriate vacuum in order to allow a deposition material to move in a substantially straight line through the thin film deposition apparatus 100.

In order to deposit the deposition material 115 emitted from the deposition source 110 and discharged through the first nozzle 120 and the second nozzle 150, on the substrate 160 in a desired pattern, the chamber should be maintained in a high-vacuum state as in a deposition method using a fine metal mask (FMM). In addition, the temperatures of the first barrier wall assembly 130, the second barrier wall assembly 140 and the second nozzle 150 should be sufficiently lower than the temperature of the deposition source 110. In this regard, the temperatures of the first barrier wall assembly 130, the second barrier wall assembly 140 and the second nozzle 150 may be about 100° C. or less. This is because the deposition material 115 that has collided against the first barrier wall assembly 130 and the second barrier wall assembly 140 may not be vaporized again when the temperatures of the first barrier wall assembly 130 and the second barrier wall assembly 140 are sufficiently low. In addition, thermal expansion of the second nozzle 150 may be minimized when the temperature of the second nozzle 150 is sufficiently low. The first barrier wall assembly 130 faces the deposition source 110, which is at a high temperature. In addition, the temperature of a portion of the first barrier wall assembly 130 close to the deposition source 110 rises by a maximum of about 85° C., and thus a partial-cooling apparatus may be further included if needed. By way of example, each of the first barrier wall assembly 130 and the second barrier wall assembly 140 may include a cooling member such as a cooling pin.

The substrate 160 is a deposition target and is disposed in the chamber. The substrate 160 may be a substrate for flat panel displays. A large substrate, such as a mother glass, for manufacturing a plurality of flat panel displays, may be used as the substrate 160. Other substrates may also be employed.

The deposition source 110 contains and heats the deposition material 115. The deposition source 110 is disposed in a side of the chamber which is opposite to the side in which the substrate 160 is disposed. As the deposition material 115 contained in the deposition source 110 is vaporized, the deposition material 115 is deposited on the substrate 160. The deposition source 110 includes a crucible 111 and a heater 115. The crucible 111 holds the deposition material 115. The heater 112 heats the crucible 111 to vaporize the deposition material 115 contained in the crucible 111 towards a side of the crucible 111, and in particular, towards the first nozzle 120.

The first nozzle 120 is disposed at a side of the deposition source 110 facing the substrate 160. The first nozzle 120 includes a plurality of first slits 121 that may be arranged at equal intervals in a Y-axis direction. The deposition material 115 that is vaporized in the deposition source 110 passes through the first nozzle 120 towards the substrate 160.

The first barrier wall assembly 130 is disposed at a side of the first nozzle 120. The first barrier wall assembly 130 includes a plurality of first barrier walls 131, and a first barrier wall frame 132 that covers sides of the first barrier walls 131. The plurality of first barrier walls 131 may be arranged parallel to each other at equal intervals in the Y-axis direction. In addition, each of the first barrier walls 131 may be formed to extend along an XZ plane in FIG. 1, (i.e., perpendicular to the Y-axis direction). The plurality of first barrier walls 131 arranged as described above partition the space between the first nozzle 120 and the second nozzle 150. In the thin film deposition apparatus 100, the deposition space is divided by the first barrier walls 131 into sub-deposition spaces that respectively correspond to the first slits 121 through which the deposition material 115 is discharged.

While not required in all aspects, the shown first barrier walls 131 are respectively disposed between adjacent first slits 121. Each of the first slits 121 is disposed between two adjacent first barrier walls 131. The first slits 121 may be respectively located at the midpoint between two adjacent first barrier walls 131, but the invention is not limited thereto. As described above, since the first barrier walls 131 partition the space between the first nozzle 120 and the second nozzle 150, the deposition material 115 discharged through any one of the first slits 121 is not mixed with deposition material 115 discharged through any other first slits 121. The deposition material 115 then passes through second slits 151, which will be described later, so as to be deposited on the substrate 160. Thus, the first barrier walls 131 guide the deposition material 115, which is discharged through the first slits 121, so as not to flow in the Y-axis direction.

The first barrier wall frame 132 has upper and lower outer walls surrounding the first barrier walls 131. The upper and lower outer walls retain the positions of the first barrier walls 131, and guide the deposition material 115, which is discharged through the first slits 121, so as not to flow in a Z-axis direction.

In addition and while not required in all aspects, the first barrier wall assembly 130 may be constructed to be detachable from the thin film deposition apparatus 100. To this end, the first barrier wall assembly 130 may be disposed to be separated from the first nozzle 120 as illustrated in FIG. 1.

A conventional FMM deposition method has low deposition efficiency. Deposition efficiency refers to the ratio of a deposition material deposited on a substrate to the deposition material vaporized from a deposition source. The conventional FMM deposition method has a deposition efficiency of about 32%. Furthermore, in the conventional FMM deposition method, about 68% of organic deposition material that is not deposited on the substrate remains adhered to a deposition apparatus, and thus reusing the deposition material is not easy.

In order to overcome these problems, in the thin film deposition apparatus 100 according to an aspect of the present invention, the deposition space is enclosed by the barrier wall assembly 130, so that the deposition material 115 that remains undeposited is mostly deposited within the barrier wall assembly 130. Thus, when a large amount of the deposition material 115 lies in the first barrier wall assembly 130 after a long deposition process, the first barrier wall assembly 130 may be detached from the thin film deposition apparatus 100 and then placed in a separate deposition material recycling apparatus to recover the deposition material 115. Due to the structure of the thin film deposition apparatus 100, a reuse rate of the deposition material 115 is increased, so that the deposition efficiency is improved, thereby reducing the manufacturing costs.

In addition, since the first barrier wall assembly 130 may be spaced apart from the first nozzle 120, heat transfer from the deposition source 110 to the first barrier wall assembly 130 is prevented. Thus, a temperature rise of the first barrier wall assembly 130 is suppressed. Furthermore, the separation of the first barrier wall assembly 130 from the first nozzle 120 provides a space that makes it easier to install a member (not shown) that blocks radiant heat from the first nozzle 120. In particular, a space is provided for a member that blocks radiant heat from a surface of the first nozzle 120 close to the first slits 121.

The separation interval between the first barrier wall assembly 130 and the first nozzle 120 may be set according to processing conditions, according to an aspect of the invention.

The second barrier wall assembly 140 is disposed at a side of the first barrier wall assembly 130. The second barrier wall assembly 140 includes a plurality of second barrier walls 141, and a second barrier wall frame 142 that covers sides of the second barrier walls 141. The plurality of second barrier walls 141 may be arranged parallel to each other at equal intervals in the Y-axis direction as shown, but the invention is not limited thereto. In addition, each of the second barrier walls 141 may be formed to extend along an XZ plane in FIG. 1, (i.e., perpendicular to the Y-axis direction) but the invention s not limited thereto. The plurality of first barrier walls 131 and the second barrier walls 141 arranged as described above partition the space between the first nozzle 120 and the second nozzle 150. In the thin film deposition apparatus 100, the deposition space is divided by the first barrier walls 131 and second barrier walls 141 into sub-deposition spaces that respectively correspond to the first slits 121 through which the deposition material 115 is discharged.

The second barrier wall frame 142 may be formed in the shape of a window frame, but the invention is not limited thereto. The second barrier walls 141 are arranged within the second barrier wall frame 142. The second barrier wall frame 142 supports the second barrier walls 141, and guides the deposition material 115, which is discharged through the first slits 121 and between the first barrier walls 131, so as not to flow in the Z-axis direction.

Although the space between the first nozzle 120 and the second nozzle 150 is defined by the first barrier wall assembly 130 and the second barrier wall assembly 140, aspects of the present invention are not limited thereto. The space between the first nozzle 120 and the second nozzle 150 may be defined only by the first barrier wall assembly 130. That is, the second barrier wall assembly 140 may not be formed. However, if both the first and second barrier wall assemblies 130 and 140 are formed, the space between the first and second nozzles 120 and 150 may be partitioned more effectively than if only the first barrier wall assembly 130 is formed. Moreover, it is understood that additional barrier wall assemblies can be added.

Referring to FIGS. 1 through 3 and while not limited thereto, the second barrier walls 141 is disposed to correspond to the first barrier walls 131 in one-to-one correspondence. The second barrier walls 141 are respectively disposed to be parallel to and to be on the same plane as the first barrier walls 131. Each pair of the corresponding first and second barrier walls 131 and 141 are shown located on the same X-Z plane. As described above, since the space between the first nozzle 120 and the second nozzle 150, which will be described later, is partitioned by the first barrier walls 131 and the second barrier walls 141, which are disposed parallel to each other, the deposition material 115 discharged through any one of the first slits 121 is not mixed with the deposition material 115 discharged through any other first slits 121, and is deposited on the substrate 160 through the second slits 151. The first barrier walls 131 and the second barrier walls 141 guide the deposition material 115, which is discharged through the first slits 121, so as not to flow in the Y-axis direction.

Although the first barrier walls 131 and the second barrier walls 141 are respectively illustrated as having the same thickness in the Y-axis direction, aspects of the present invention are not limited thereto. The second barrier walls 141, which should be accurately aligned with the second nozzle 150, may be formed to be relatively thin, whereas the first barrier walls 131, which do not need to be precisely aligned with the second nozzle 150, may be formed to be relatively thick. This makes it easier to manufacture the thin film deposition apparatus 100.

The second nozzle 150 and the second nozzle frame 155 are disposed between the deposition source 110 and the substrate 160. While not required, the shown second nozzle frame 155 is formed as a window frame having two approximately arched sides. The second nozzle 150 is bound inside the second nozzle frame 155. The second nozzle 150 includes a plurality of second slits 151 that may be arranged at equal intervals in the Y-axis direction. The deposition material 115 that is vaporized in the deposition source 110 passes through the first nozzle 120 and the second nozzle 150 towards the substrate 160. The second nozzle frame 155 will be described in detail later.

In the thin film deposition apparatus 100, the total number of second slits 151 may be greater than the total number of first slits 121. In addition, there may be a greater number of second slits 151 than first slits 121 disposed between two adjacent first barrier walls 131.

At least one first slit 121 may be disposed between each two adjacent first barrier walls 131. Similarly, a plurality of second slits 151 may be disposed between each two adjacent first barrier walls 131. The space between the first nozzle 120 and the second nozzle 150 is partitioned by the first barrier walls 131 into sub-deposition spaces that correspond to the first slits 121, respectively. Thus, the deposition material 115 discharged from any one of the first slits 121 passes through a plurality of second slits 151 disposed in the sub-deposition space corresponding to the first slit 121, and is then deposited on the substrate 160.

Although three second slits 151 are shown in FIG. 3 as corresponding to each of the first slits 121, aspects of the present invention are not limited thereto. The ratio of the number of second slits 151 to each first slit 121 may vary according to the requirements of a product to be manufactured.

The second nozzle 150 may be manufactured by etching, which is the same method as used in a conventional method of manufacturing an FMM, and in particular, a striped FMM. In the conventional FMM deposition method, the size of the FMM has to be equal to the size of a substrate. Thus, the size of the FMM has to be increased as the substrate becomes larger. However, it is neither straightforward to manufacture a large FMM nor to extend an FMM to be accurately aligned with a pattern. However, in the thin film deposition apparatus 100, a thin layer is deposited while the thin film deposition apparatus 100 is moved in the Z-axis direction within the chamber (not shown). In other words, once the thin film deposition apparatus 100 has completed deposition at a current location, either the thin film deposition apparatus 100 or the substrate 160 is moved relative to each other in the Z-axis direction for further continuous deposition. Thus, in the thin film deposition apparatus 100, the second nozzle 150 may be significantly smaller than an FMM used in a conventional deposition method. In the thin film deposition apparatus 100, the length of the second nozzle 150 in the Z-axis direction may be less than the length of the substrate 160 in the Z-axis direction, provided that the width of the second nozzle 150 in the Y-axis direction is equal to the width of the substrate 160 in the Y-axis direction. As described above, since the second nozzle 150 may be formed to be significantly smaller than an FMM used in a conventional deposition method, it is relatively easy to manufacture the second nozzle 150. The use of the second nozzle 150 is smaller than an FMM used in a conventional deposition method and is more convenient in all processes. Examples of such processes include etching and subsequent other processes, such as precise extension, welding, moving, and cleaning processes. As compared to the conventional deposition method using the larger FMM, the deposition apparatus 100 is more convenient and is more advantageous for a relatively large display device.

Figure 4:
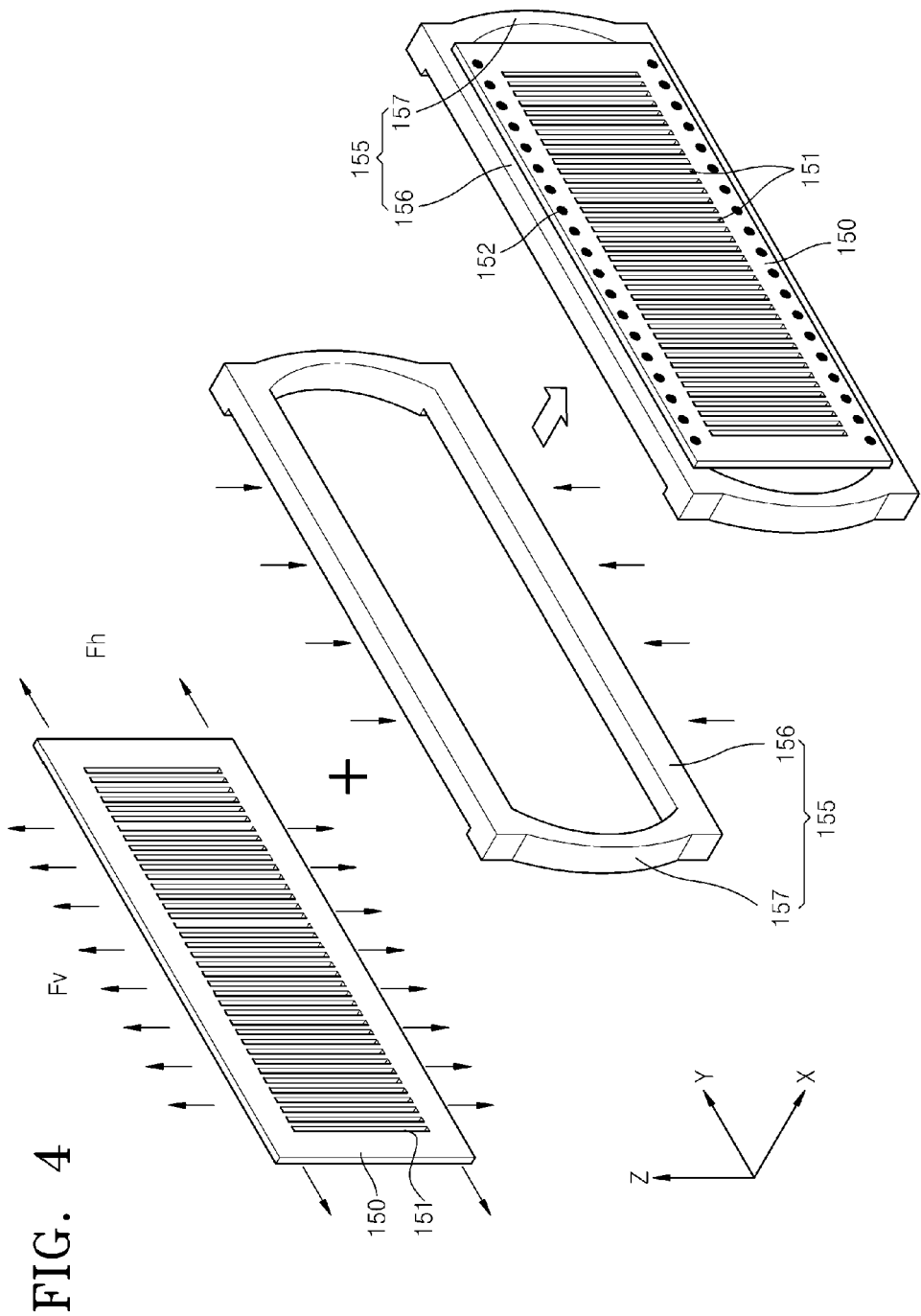
FIG. 4 is a schematic perspective view illustrating a binding structure of the second nozzle and the second nozzle frame, according to an embodiment of the present invention.

FIG. 4 is a schematic perspective view illustrating a binding structure of the second nozzle 150 and the second nozzle frame 155, according to an embodiment of the present invention.

The second nozzle 150 is formed as a thin film and may be fixed to the thin film deposition apparatus 100 via the second nozzle frame 155.

Referring to FIG. 4, the second nozzle frame 155 may be formed in a lattice shape, which will be described in detail later, such as a window frame having two approximately arched sides. The second nozzle 150 includes the plurality of second slits 151 and is bound inside the second nozzle frame 155. In the thin film deposition apparatus 100, the second nozzle 150 is bound to the second nozzle frame 155 such that a tensile force is exerted on the second nozzle 150 by the second nozzle frame 155.

In particular, a degree of pattern precision of the second nozzle 150 may be affected by a manufacturing error and a thermal expansion error during a deposition process of the second nozzle 150. In order to minimize manufacturing errors of the second nozzle 150, a counter force technique used to precisely extend an FMM and weld it to a frame can be used. This will now be described in detail below. Initially, as illustrated in FIG. 4, an external tensile force is applied to the second nozzle 150 so that the second nozzle 150 is stretched outwards. Next, a compression force is applied to the second nozzle frame 155 in an opposite direction to the direction in which the external tensile force is applied to the second nozzle 150, such that the compression force is in equilibrium with the external tensile force applied to the second nozzle 150. Then, the second nozzle 150 is bound to the second nozzle frame 155 by, for example, welding edges of the second nozzle 150 to the second nozzle frame 155. FIG. 4 illustrates the second nozzle 150 and the second nozzle frame 155 bound to each other by welding points 152.

Finally, the second nozzle 150 and the second nozzle frame 155 are relieved from all the external forces applied thereto to reach equilibrium, so that only a tensile force is exerted on the second nozzle 150 by the second nozzle frame 155. When such precise extension, compression, and welding techniques as described above are used, the second nozzle 150 may be manufactured with a manufacturing error of 2 μm or less.

In the thin film deposition apparatus 100, the temperature of the second nozzle frame 150 may be maintained constant. In particular, the second nozzle 150, which is disposed to face the deposition source 110 whose temperature is high, is always exposed to radiant heat from the deposition source 110, so that the temperature of the second nozzle 150 is increased to some extent, for example, by about 5 to about 15° C. However, when the temperature of the second nozzle 150 is increased, the second nozzle 150 may expand, thus deteriorating a degree of pattern precision of the second nozzle 150. In order to overcome this problem, according to an aspect of the present invention, the second nozzle 150 is used. As shown, the second nozzle 150 is a stripe type nozzle, but the invention is not limited thereto. The second nozzle frame 155 supports the second nozzle 150 such that a tensile force is exerted on the second nozzle 150. The temperature of the second nozzle frame 155 is maintained constant, thereby preventing pattern errors due to a temperature increase of the second nozzle 150.

The thermal expansion (pattern error) of the second nozzle 150 in a horizontal direction (Y-axis direction) is affected by the temperature of the second frame nozzle 155. Thus, if the temperature of the second nozzle frame 155 is maintained constant, such an error in the pattern of the second nozzle 150 caused due to the thermal expansion does not occur even when the temperature of the second nozzle 150 rises. In addition, the second nozzle 150 thermally expands in a vertical direction (Z-axis direction). However, the vertical direction of the second nozzle 150 is a scanning direction that is irrelevant to the degree of pattern precision of the second nozzle 150.

The second nozzle frame 155 does not directly face the deposition source 110 in a vacuum condition, and thus is not exposed to the radiant heat from the deposition source 110. In addition, since the second nozzle frame 155 is not connected to the deposition source 110, there is no thermal conduction between the deposition source 110 and the second nozzle frame 155. Thus, the temperature of the second nozzle frame 155 is unlikely to rise. Even if the temperature of the second nozzle frame 155 rises slightly, for example, by 1 to 3° C., the temperature of the second nozzle frame 155 may be easily maintained constant, such as through the use of a thermal shield or a radiation fin.

As described above, when the second nozzle frame 155 exerts a tensile force on the second nozzle 150 and the temperature of the second nozzle frame 155 is maintained constant, the thermal extension problem with the second nozzle 150 no longer affects a problem of pattern precision of the second nozzle 150. Thus, the degree of pattern precision of the second nozzle 150 may be further improved. When precise extension, compression, and welding techniques are used as described above, the second nozzle 150 may be manufactured with a manufacturing error of 2 µm or less. In addition, an error in the pattern of the second nozzle 150 caused due to the thermal expansion of the second nozzle 150, which occurs as the temperature of the second nozzle 150 rises, may be prevented by supporting the second nozzle 150 such that a tensile force is exerted thereon and by maintaining the temperature of the second nozzle frame 155 to be constant. Thus, the second nozzle 150 may be manufactured with an error of less than 2 µm, which is attributed to a manufacturing error (<2) of the second nozzle 150 and a thermal expansion error (~0) of the second nozzle 150.

Figure 5:
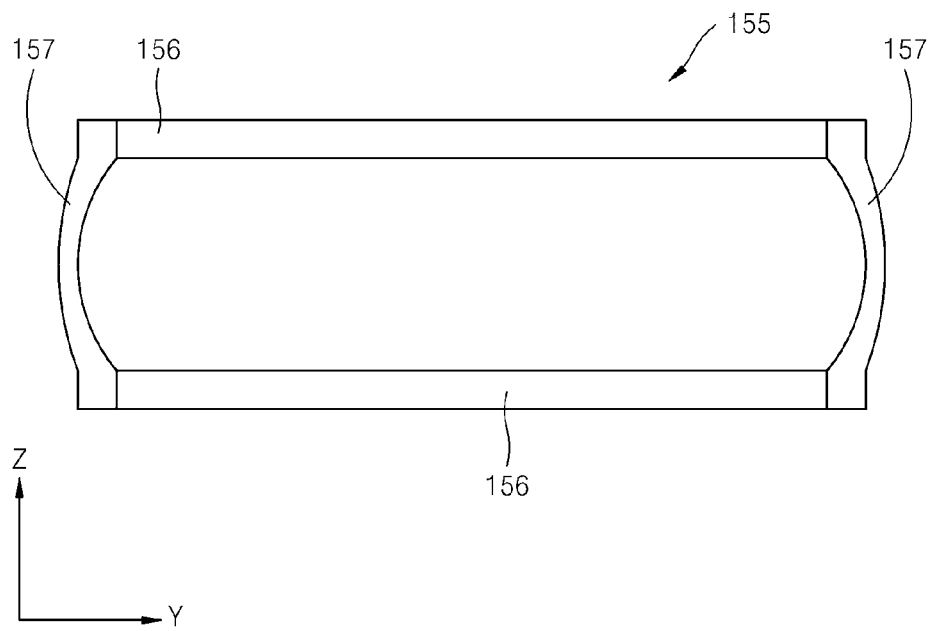
FIG. 5 is a front view of the second nozzle frame illustrated in FIG. 1.
Figure 6:
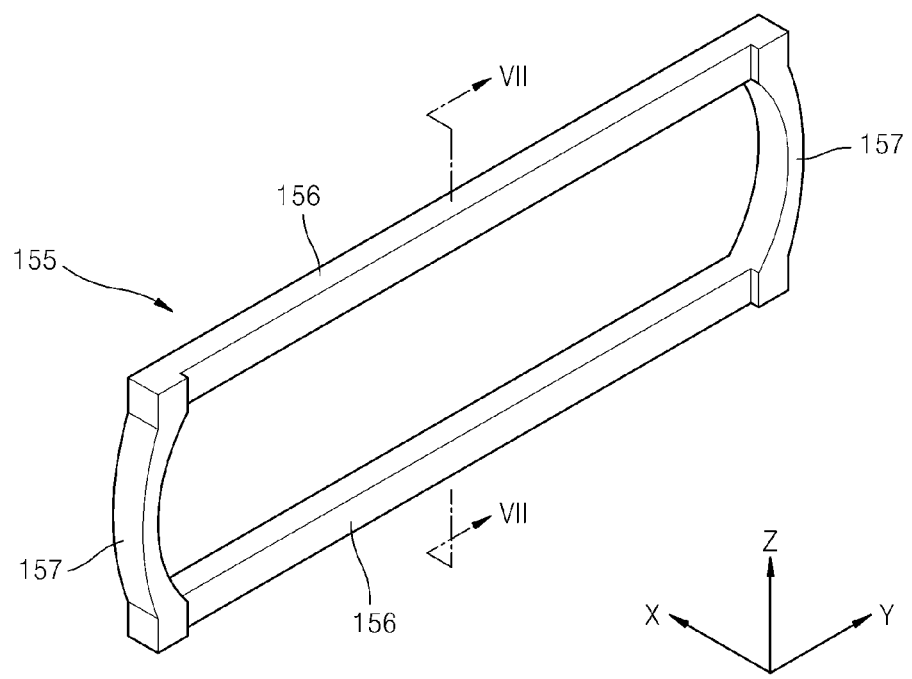
FIG. 6 is a perspective view of the second nozzle frame illustrated in FIG. 1.
Figure 7A:
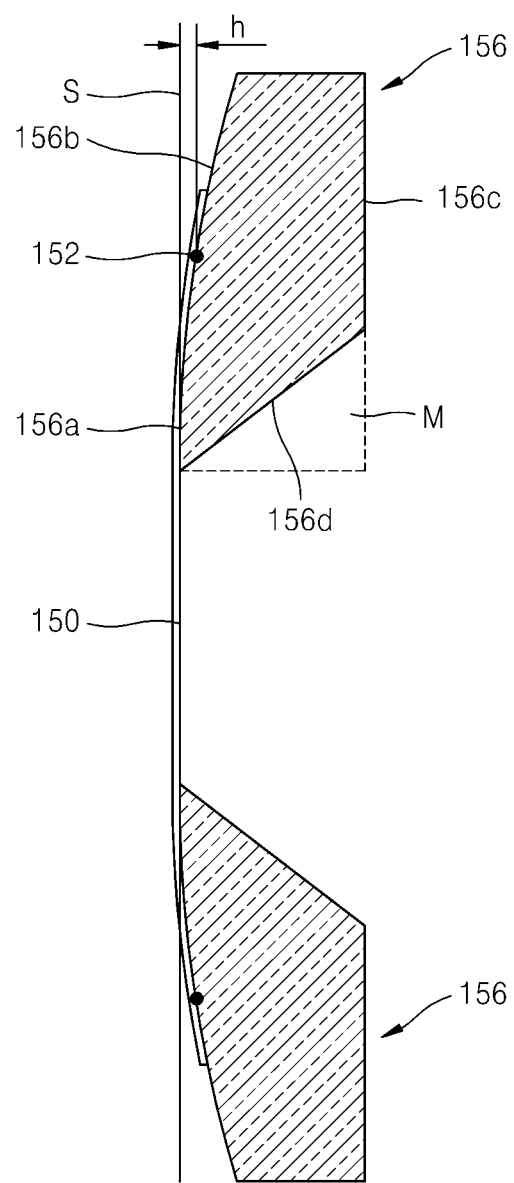
FIG. 7A is a cross-sectional view taken along line VII-VII of FIG. 6, according to an embodiment of the present invention.

FIG. 5 is a front view of the second nozzle frame 155 illustrated in FIG. 1. FIG. 6 is a perspective view of the second nozzle frame 155 illustrated in FIG. 1. FIG. 7A is a cross-sectional view taken along line VII-VII of FIG. 6, according to an embodiment of the present invention. For convenience of explanation, unlike FIGS. 1 and 4, FIG. 6 illustrates the second nozzle frame 155 viewed in a direction from the deposition source 110 illustrated in FIG. 1.

Also, for convenience of explanation, the second nozzle 150 illustrated in FIG. 1 is not illustrated in FIGS. 5 and 6 but is illustrated in FIG. 7A. Referring to FIGS. 5, 6, and 7A, the second nozzle frame 155 includes first frame portions 156 and second frame portions 157. In more detail, the second nozzle frame 155 includes two first frame portions 156 extending in one direction (the Y direction) in parallel with each other. The second nozzle frame 155 also includes two second frame portions 157 connecting the two first frame portions 156 to each other.

The second portions 157 are curved in one direction (the Y direction) so as to have an arched shape. That is, the second portions 157 form two convex sides of the second nozzle frame 155.

As illustrated in FIG. 4, a compression force is applied to the second nozzle frame 155 in an up/down direction (the Z direction) in order to bind the second nozzle frame 155 to the second nozzle 150, and then is removed after the second nozzle frame 155 and the second nozzle 150 are bound to each other. As described above in relation to FIG. 4, the compression force during the binding process corresponds to a tensile force applied to the second nozzle 150 after the bonding process is completed. In this case, the first frame portions 156 of the second nozzle frame 155 sags in a direction in which the compression force is applied. The sagging of the first frame portions 156 is similar to the sagging of beams in buildings.

Meanwhile, the second nozzle 150 should be precisely aligned with the substrate 160, which is a deposition target. For the precise alignment, precise binding between the second nozzle 150 and the second nozzle frame 155 is important. However, if the second nozzle frame 155 is seriously deformed when the second nozzle 150 and the second nozzle frame 155 are bound together, the second nozzle frame 155 and the second nozzle 150 may fail to be bound at a desired position and thus the second nozzle 150 may not be precisely aligned with the substrate 160.

In an aspect of the present invention, the second frame portions 157 of the second nozzle frame 155 are formed in an arched shape. The arched second frame portions 157 have less resistance against a compression force than straight shaped second frame portions. That is, when the same compression force is applied, an arched structure contracts more than a straight structure. As such, the second frame portions 157 may buffer the compression force applied to the first frame portions 156. That is, when the compression force is applied to the second nozzle frame 155, the second frame portions 157 contract more than the first frame portions 156 by the compression force, and thus uneven deflection of the first frame portions 156 may be prevented.

Accordingly, due to the second frame portions 157 formed in an arched shape, the second nozzle 150 and the second nozzle frame 155 are combined at a desired position and thus precise alignment between the second nozzle 150 and the substrate 160 may not be disturbed.

When the second frame portions 157 are formed in an arched shape, the thicknesses of center portions of the second frame portions 157 are less than the thicknesses of both ends of the second frame portions 157, i.e., parts connected to the first frame portions 156. If the center portion of an arched structure is formed to be thinner than both ends thereof, the amount of deformation is reduced when a force is applied to the both ends. As such, due to the above-described structure of the second frame portions 157, the deformation of the second nozzle frame 155 may be more effectively prevented.

Meanwhile, each of the first frame portions 156 of the second nozzle frame 155 includes various surfaces such as a first surface 156a, a second surface 156b, a third surface 156c, and a fourth surface 156d. In more detail, the first and second surfaces 156a and 156b are disposed at a front side of the second nozzle frame 155, i.e., disposed to face the substrate 160, and the third and fourth surfaces 156c and 156d are disposed to face a direction opposite to the substrate 160.

The first and second surfaces 156a and 156b are adjacent to each other and the first surface 156a is closer to the center of the second nozzle frame 155 than the second surface 156b. In other words, the first surface 156a is closer to the second slits 151 of the second nozzle 150 than the second surface 156b. The first surface 156a is flat and the second surface 156b is sloping.

The second nozzle 150 that is bound to the second nozzle frame 155 may be flat in order to perform precise deposition on the substrate 160, i.e., a deposition target. Since the second nozzle 150 is bound to the second nozzle frame 155, the flatness of the second nozzle 150 is greatly influenced by the second nozzle frame 155. In particular, the flatness on a center portion of the second nozzle 150, in which the second slits 151 are formed, is important.

The first surface 156a is close to the second slits 151 and starts to contact the second nozzle 150 with reference to the second slits 151. The flatness of the second nozzle 150 may be easily ensured by forming the first surface 156a, which is close to the second slits 151 and starts to contact the second nozzle 150, to be flat.

The second surface 156b may be curved, or gently curved. As such, an extension line S of the first surface 156a does not coincide with the second surface 156b. The welding points 152 for binding the second nozzle 150 to the second nozzle frame 155 are formed on the second surface 156b in order to prevent the welding points 152 from contacting a deposition target during deposition. Consequently, scratches on the substrate 160 are prevented. In FIG. 7A, the welding points 152 are formed on the second surface 156b with a gap h from the extension line S of the first surface 156a. The more the gap h is increased, the more easily scratches on the substrate 160 due to the welding points 152 may be prevented. However, if the gap h is excessively great, a welding process when the second nozzle 150 and the second nozzle frame 155 are bound using the welding points 152 may not be easily performed, and a binding force between the second nozzle 150 and the second nozzle frame 155 may be reduced. Thus, the flatness of the second nozzle 150 may be reduced. Therefore, the gap h may be appropriately determined according to the conditions of a deposition process.

The third surface 156c of the second nozzle frame 155 is disposed in a direction opposite to the direction toward the deposition target, (i.e., in a direction away from the second nozzle 150), and is formed to be flat. The second barrier wall frame 142 is disposed at the rear side of the second nozzle frame 155, (i.e., in the direction away from the second nozzle 150). In this case, the space of the thin film deposition apparatus 100 may be reduced by allowing the second barrier wall frame 142 of the second barrier wall assembly 140 to contact the third surface 156c of the second nozzle frame 155. The second barrier wall frame 142 may easily contact the second nozzle frame 155 by forming the third surface 156c to be flat and also forming a surface of the second barrier wall frame 142, which corresponds to the third surface 156c, to be flat.

The fourth surface 156d of the second nozzle frame 155 connects the third surface 156c to the first surface 156a. The fourth surface 156d is formed to have a slope. In this case, an obtuse angle is formed between the third and fourth surfaces 156c and 156d. That is, the fourth surface 156d and an extension line of the third surface 156c form a space M having a triangular shape. The space M may be occupied by the second barrier wall frame 142 or the second barrier walls 141 when the second barrier wall assembly 140 is disposed at the rear side of the second nozzle frame 155. Thus, the placing of the second barrier wall assembly 140 at the rear side of the second nozzle frame 155 is easy.

Figure 7B:
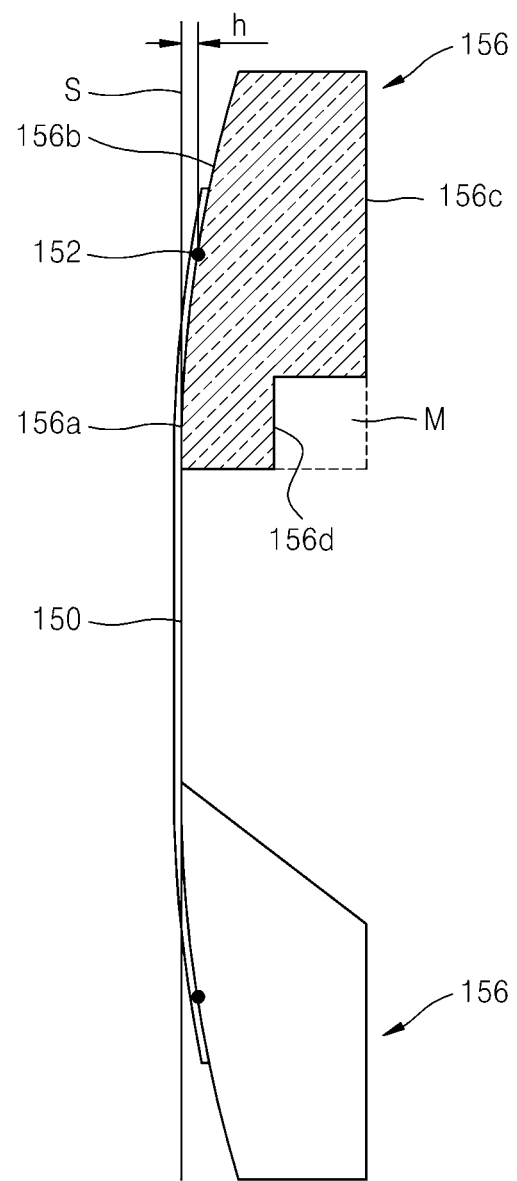
FIG. 7B is a cross-sectional view of a modification of FIG. 7A.

However, the second nozzle frame 155 may be modified to form a space for the second barrier walls 141 instead of the space M having a triangular shape. FIG. 7B illustrates a modification of FIG. 7A. Referring to FIG. 7B, the third surface 156c is disposed in a direction opposite to a direction toward a deposition target, (i.e., in a direction away from the second nozzle 150), and is formed to be flat. As such, as described above, the second barrier wall frame 142 may easily contact the second nozzle frame 155.

In FIG. 7B, the fourth surface 156d of the second nozzle frame 155 is disposed in a direction away from the second nozzle 150, and is adjacent to the third surface 156c. The fourth surface 156d is formed to have a step with respect to the third surface 156c and has a surface substantially parallel with the third surface 156c. In more detail, the fourth surface 156d is closer to the second slits 151 of the second nozzle 150 than the third surface 156c. The fourth surface 156d may be formed to be flat such that the fourth surface 156d and an extension line of the third surface 156c form a rectangular space M.

As described above, the space M may be occupied by the second barrier wall frame 142 or the second barrier walls 141 when the second barrier wall assembly 140 is disposed at the rear side of the second nozzle frame 155, and thus the second barrier wall assembly 140 may be easily disposed at the rear side of the second nozzle frame 155.

In the thin film deposition apparatus 100, the first barrier wall assembly 130 and the second barrier wall assembly 140 are disposed to be separated from each other by a predetermined distance. The first barrier wall assembly 130 and the second barrier wall assembly 140 are separated from each other for the following reasons. However, it is understood that the assemblies 130, 140 need not be separated in all aspects.

The second barrier walls 141 and the second nozzle 150 should be precisely aligned with each other, whereas it is unnecessary to precisely align the first barrier walls 131 and the second barrier walls 141. Thus, high-precision control may be easily achieved by separating a part required to be precisely controlled from a part not required to be precisely controlled.

In addition, the second barrier walls 141 and the second nozzle 150 should be aligned with the substrate 160 to be accurate in position and to have a constant interval therebetween, and thus may require high-precision control. Thus, in order to make it easy to control such parts that require high-precision control, the second barrier wall assembly 140 and the second nozzle 150 are separated from the deposition source 110, the first nozzle 120, and the first barrier wall assembly 130. The deposition source 110, the first nozzle 120, and the first barrier wall assembly 130 are relatively heavy parts not requiring precise control.

The temperature of the first barrier wall assembly 130 may increase to 100° C. or higher due to the high temperature of the deposition source 110. In order to prevent the heat of the first barrier wall assembly 130 from being conducted to the second barrier wall assembly 140 and the second nozzle 150, the first barrier wall assembly 130 and the second barrier wall assembly 140 are separated from each other.

When the second nozzle 150 is separated from the chamber, it may be more straightforward to separate both the second nozzle 150 and the second barrier wall assembly 140 together than to separate only the second nozzle 150. In order to make it more straightforward to separate the second nozzle 150 and the second barrier wall assembly 140 together from the chamber, the first barrier wall assembly 130 and the second barrier wall assembly 140 are separated from each other.

In the thin film deposition apparatus 100, the deposition material 115 adhered to the first barrier wall assembly 130 is mostly reused, whereas the deposition material 115 adhered to the second barrier wall assembly 140 and the second nozzle 150 may not be reused. Thus, when the first barrier wall assembly 130 is separated from the second barrier wall assembly 140 and the second nozzle 150, it may be straightforward to recover the deposition material 115 to be reused.

A calibration plate (not shown) may be further installed in order to ensure uniformity of a thin layer over the entire substrate 160. When the first barrier wall assembly 130 is separated from the second barrier wall assembly 140, it is very easy to install the calibration plate.

Finally, a partition (not shown) may be further installed in order to prevent deposition of the deposition material 115 on the second nozzle 150 after deposition onto the substrate 160 has been completed and before another substrate is subjected to deposition. This may extend a nozzle exchange cycle. It is straightforward to install the partition between the first barrier walls 131 and the second barrier walls 141. Accordingly, the first barrier wall assembly 130 and the second barrier wall assembly 140 are separated from each other.

Figure 8:
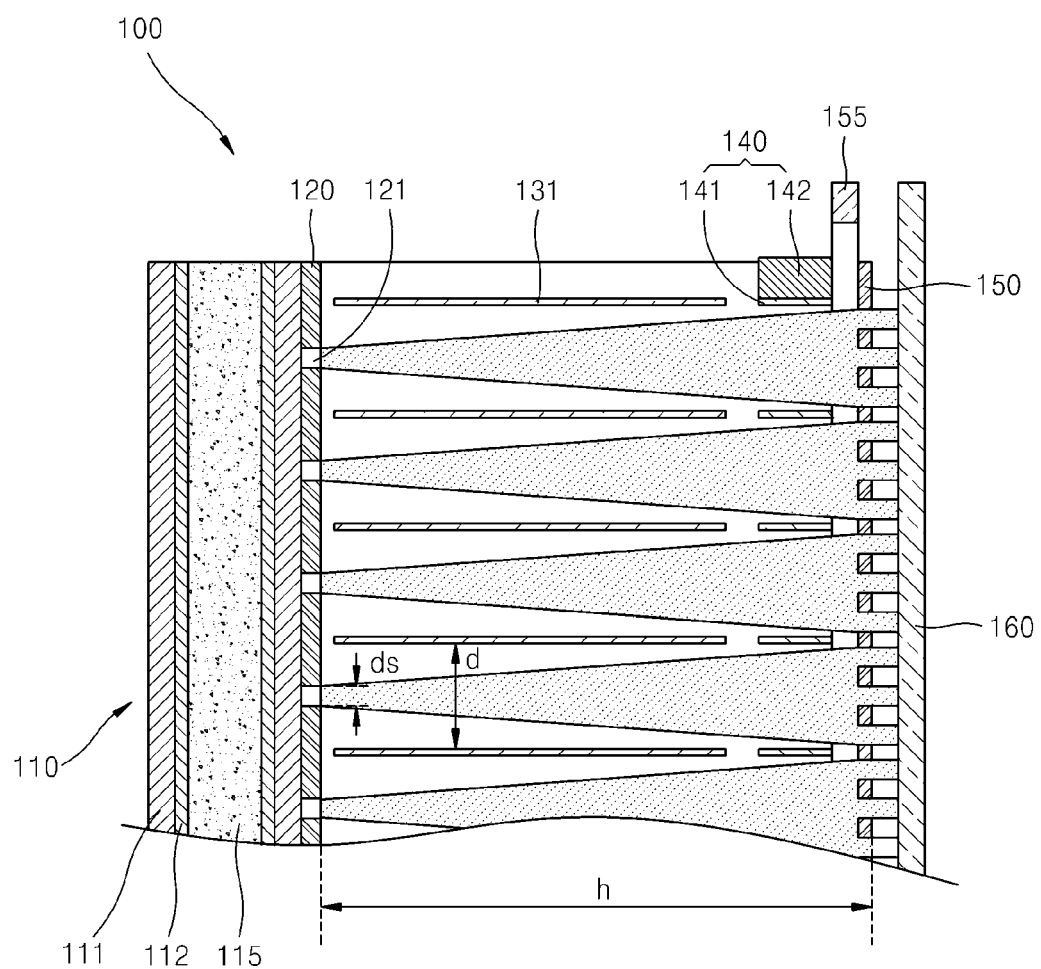
FIG. 8 is a schematic view of the thin film deposition apparatus of FIG. 1 explaining a deposition process, according to an embodiment of the present invention.
Figure 9:
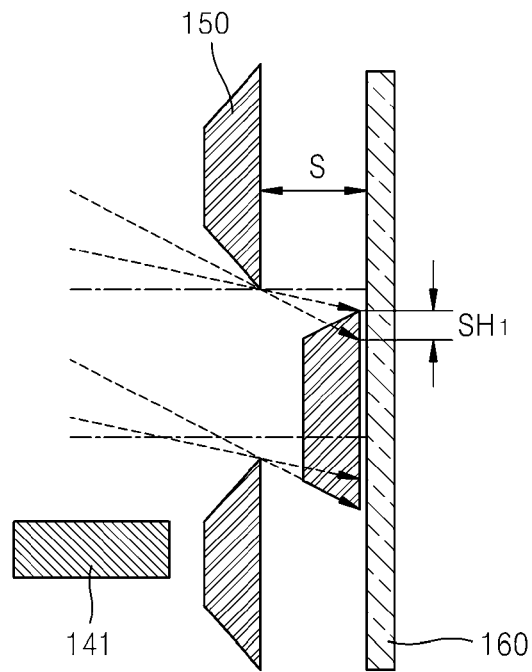
FIG. 9 illustrates a shadow zone of a thin layer deposited on a substrate when a deposition space is partitioned by first barrier walls and second barrier walls, as illustrated in FIG. 8.
Figure 10:
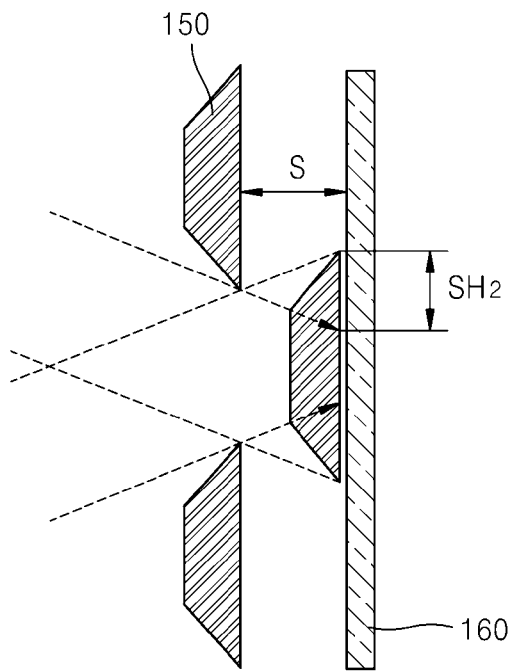
FIG. 10 illustrates a shadow zone of a thin layer deposited on the substrate when the deposition space is not partitioned.

FIG. 8 is a schematic view illustrating deposition of the deposition material 115 in the thin film deposition apparatus 100, according to an embodiment of the present invention. FIG. 9 illustrates a shadow zone of a thin layer deposited on the substrate 160 when the deposition space is partitioned by the first barrier walls 131 and the second barrier walls 141 as illustrated in FIG. 8. FIG. 10 illustrates a shadow zone of a thin layer deposited on the substrate 160 when the deposition space is not partitioned.

Referring to FIG. 8, the deposition material 115 that is vaporized in the deposition source 110 passes through the first nozzle 120 and the second nozzle 150 and is then deposited on the substrate 160. Since the space between the first nozzle 120 and the second nozzle 150 is partitioned by the first barrier wall assembly 130 and the second barrier wall assembly 140, the deposition material 115 discharged through any one of the first slits 121 of the first nozzle 120 is not mixed with the deposition material 115 discharged through any other adjacent first slits 121 due to the first barrier wall assembly 130 and the second barrier wall assembly 140.

When the space between the first nozzle 120 and the second nozzle 150 is partitioned by the first barrier wall assembly 130 and the second barrier wall assembly 140, an angle at which the deposition material 115 meets the second nozzle 150 may be controlled by adjusting an interval d between each two adjacent first barrier walls 131 or each two adjacent second barrier walls 141. As the interval d between each two adjacent first or second barrier walls 131 or 141 is decreased, as illustrated in FIG. 9, the deposition material 115 is deposited on the substrate 160 through the second nozzle 150 at an angle that is substantially perpendicular to the substrate 160. Also, as the interval d between each two adjacent first or second barrier walls 131 or 141 is increased, the angle at which the deposition material 115 meets the second nozzle 150 may be small. A width $SH_1$ of the shadow zone formed on the substrate 160 is determined according to Equation 1.

$$SH_1 = S \cdot d_s/h \qquad \text{[Equation 1]}$$

where S represents a distance between the second nozzle 150 and the substrate 160, $d_s$ represents a width of the first slits 121 adjacent to the deposition source 110, and h represents a distance between the deposition source 110 and the second nozzle 150.

However, when the space between the first nozzle 120 and the second nozzle 150 is not partitioned by the first barrier wall assembly 130 and the second barrier wall assembly 140, as illustrated in FIG. 10, the deposition material 115 is discharged through the second nozzle 150 in a wider range of angles than in the case of FIG. 9. This is because the deposition material 115 discharged not just through a first slit 121 directly facing a second slit 151 but also through first slits 121 other than the first slit 121 above, passes through the second slit 151 above and is then deposited on the substrate 160. Thus, a width $SH_2$ of a shadow zone formed on the substrate 160 is much greater than when the deposition space is partitioned by the first and second barrier walls 131 and 141. The width $SH_2$ of the shadow zone formed on the substrate 160 is determined using Equation 2.

$$SH_2 = S \cdot 2n/h \qquad \text{[Equation 2]}$$

where S denotes a distance between the second nozzle 150 and the substrate 160, n denotes the interval between each two adjacent first slits 121, and h denotes a distance between the deposition source 110 and the second nozzle 150.

Referring to Equations 1 and 2, $d_s$, which is the width of the first slits 121, is several to several tens of times smaller than n, which is the interval between each two adjacent first slits 121. Thus, the shadow zone may have a smaller width when the space between the first nozzle 120 and the second nozzle 150 is partitioned by the first barrier wall assembly 130 and the second barrier wall assembly 140. Referring to FIG. 10, the width $SH_2$ of the shadow zone formed on the substrate 160 may be reduced by any of the following: (1) by reducing the interval ("n") between the adjacent first slits 121, (2) by reducing the distance ("S") between the second nozzle 150 and the substrate 160, or (3) by increasing the distance ("h") between the deposition source 110 and the second nozzle 150.

As described above, the shadow zone formed on the substrate 160 may be reduced by installing the first barrier wall assembly 130 and the second barrier wall assembly 140. Thus, the second nozzle 150 can be separated from the substrate 160.

Thus, in the thin film deposition apparatus 100, the second nozzle 150 may be separated from the substrate 160 by a predetermined distance. In a conventional deposition method using a FMM, deposition is performed with the FMM in close contact with a substrate in order to prevent formation of a shadow zone on the substrate. However, when the FMM is used in close contact with the substrate, the contact may cause defects. In order to overcome this problem, in the thin film deposition apparatus 100, the second nozzle 150 is disposed to be separated from the substrate 160 by a predetermined distance. This may be implemented by installing the first barrier wall assembly 130 and the second barrier wall assembly 140 to reduce the width of the shadow zone formed on the substrate 160.

As described above, according to aspects of the present invention, a defect caused due to the contact between a substrate and a FMM, which occurs in a conventional deposition method, may be prevented. In addition, since it is unnecessary to use the FMM in close contact with the substrate during a deposition process, the manufacturing speed may be improved.

Figure 11:
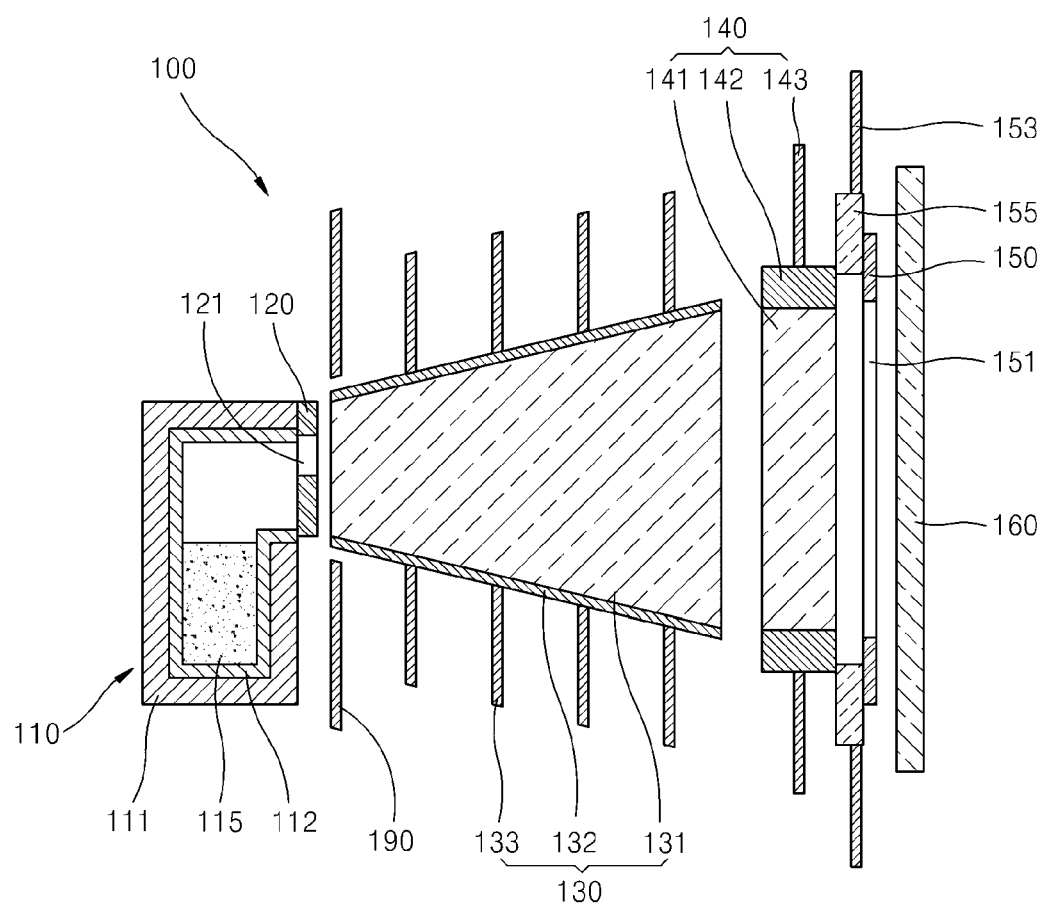
FIG. 11 is a schematic view of a thin film deposition apparatus including a cooling member, according to an embodiment of the present invention.

FIG. 11 is a schematic view of a thin film deposition apparatus including a cooling member, according to another embodiment of the present invention. Referring to FIG. 11, each of the first barrier wall assembly 130 and the second barrier wall assembly 140 may further include a cooling member. In particular, the temperatures of the first barrier wall assembly 130 and the second barrier wall assembly 140 should be maintained to be considerably lower than the temperature of the deposition source 110. To do so, each of the first barrier wall assembly 130 and the second barrier wall assembly 140 may further include a cooling member. For the shown example, the first barrier wall assembly 132 and the second barrier wall assembly 142 further include a first cooling fin 133 and a second cooling fin 143, respectively. The first cooling fin 133 is formed to protrude from an outer circumference of the first barrier wall frame 132 in order to radiatively cool the heat of the first barrier wall assembly 130. The second cooling fin 143 is formed to protrude from an outer surface of the second barrier wall frame 142 in order to radiatively cool the second barrier wall assembly 140. Alternatively, although not illustrated, a water-cooling method may be applied, whereby a pipe is installed in the first barrier wall assembly 130 and the second barrier wall assembly 140, and a coolant flows through the pipe. However, the types of cooling members are not limited to these examples.

In addition, the second nozzle frame 155 further includes a radiation fin 153. A thermal shield 190 is further disposed between the deposition source 110 and the second nozzle frame 155.

The second nozzle frame 155 does not directly face the deposition source 110 in a vacuum condition, and thus is not exposed to the radiant heat from the deposition source 110. In addition, since the second nozzle frame 155 is not connected to the deposition source 110, there is no thermal conduction therebetween. Thus, the temperature of the second nozzle frame 155 is unlikely to rise. However, the temperature of the second nozzle frame 155 is still likely to rise slightly by about 1 to about 3° C. Such a temperature rise may be prevented via the radiation fin 153, so that the temperature of the second nozzle frame 155 may be maintained constant. The radiation fin 153 may be formed to protrude from an outer surface of the second nozzle frame 155 in order to radiatively cool the second nozzle frame 155. In addition, the heat radiated from the deposition source 110 towards the second nozzle frame 155 may be blocked by installing the thermal shield 190 between the deposition source 110 and the second nozzle frame 55, so that the temperature of the second nozzle frame 155 may be maintained constant.

Figure 12:
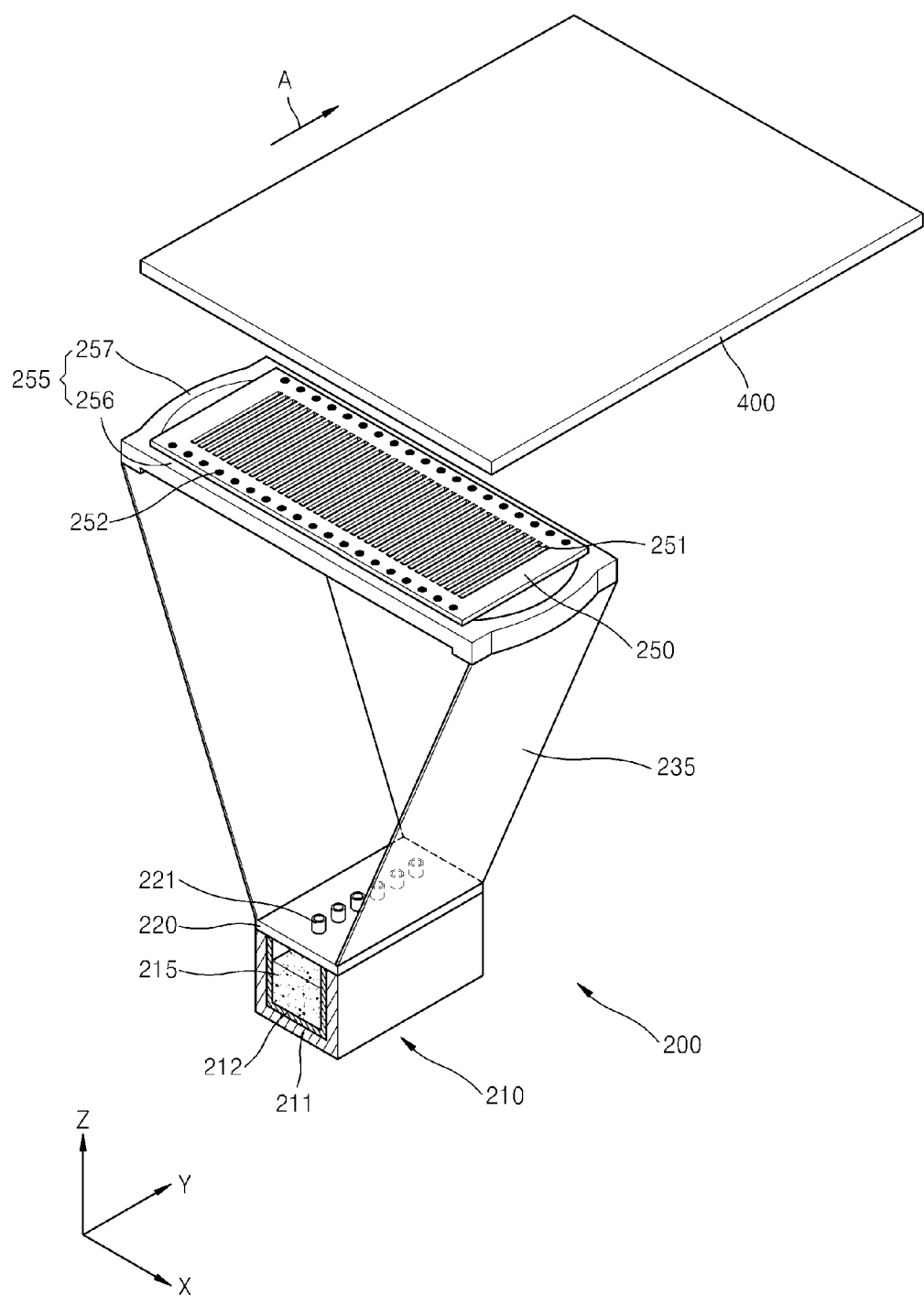
FIG. 12 is a schematic perspective view of a thin film deposition apparatus according to another embodiment of the present invention.
Figure 13:
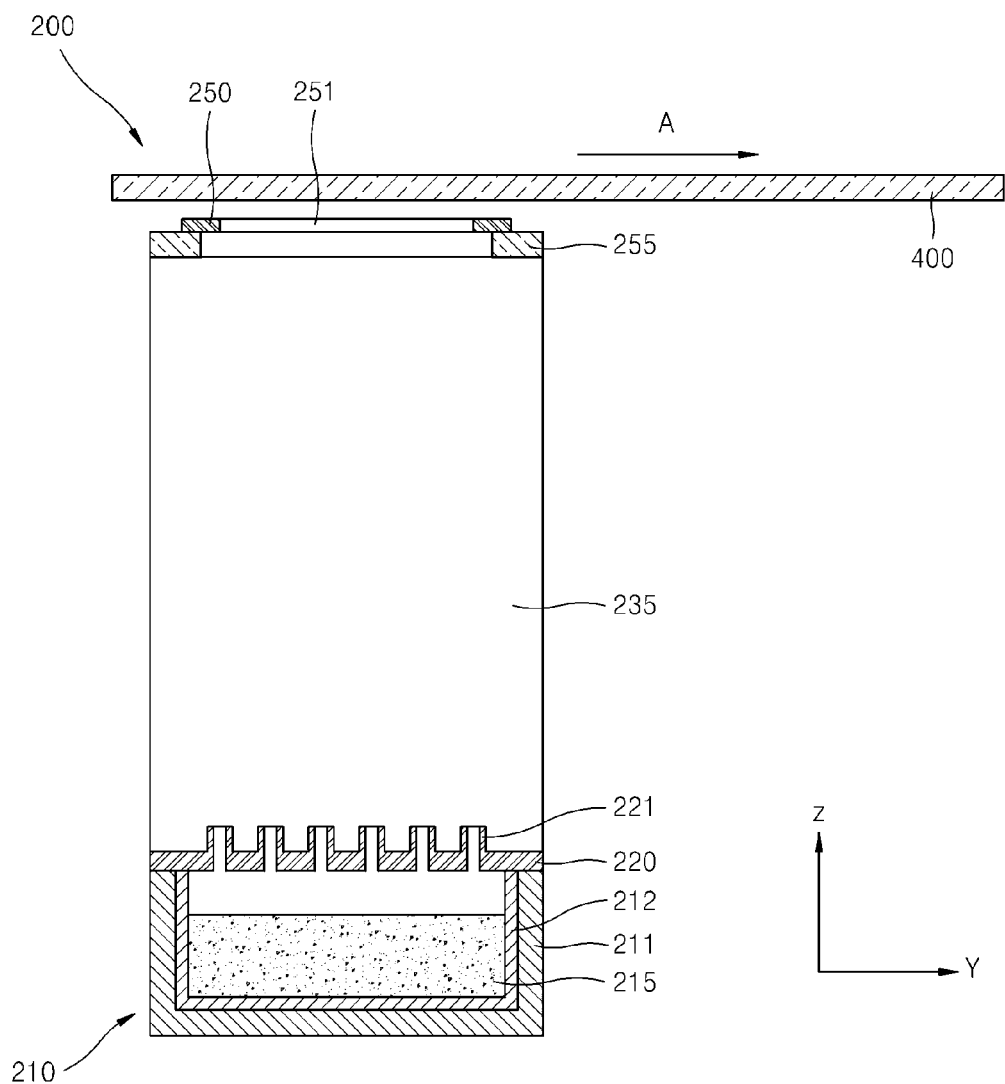
FIG. 13 is a schematic plan view of the thin film deposition apparatus of FIG. 12, according to an embodiment of the present invention.
Figure 14:
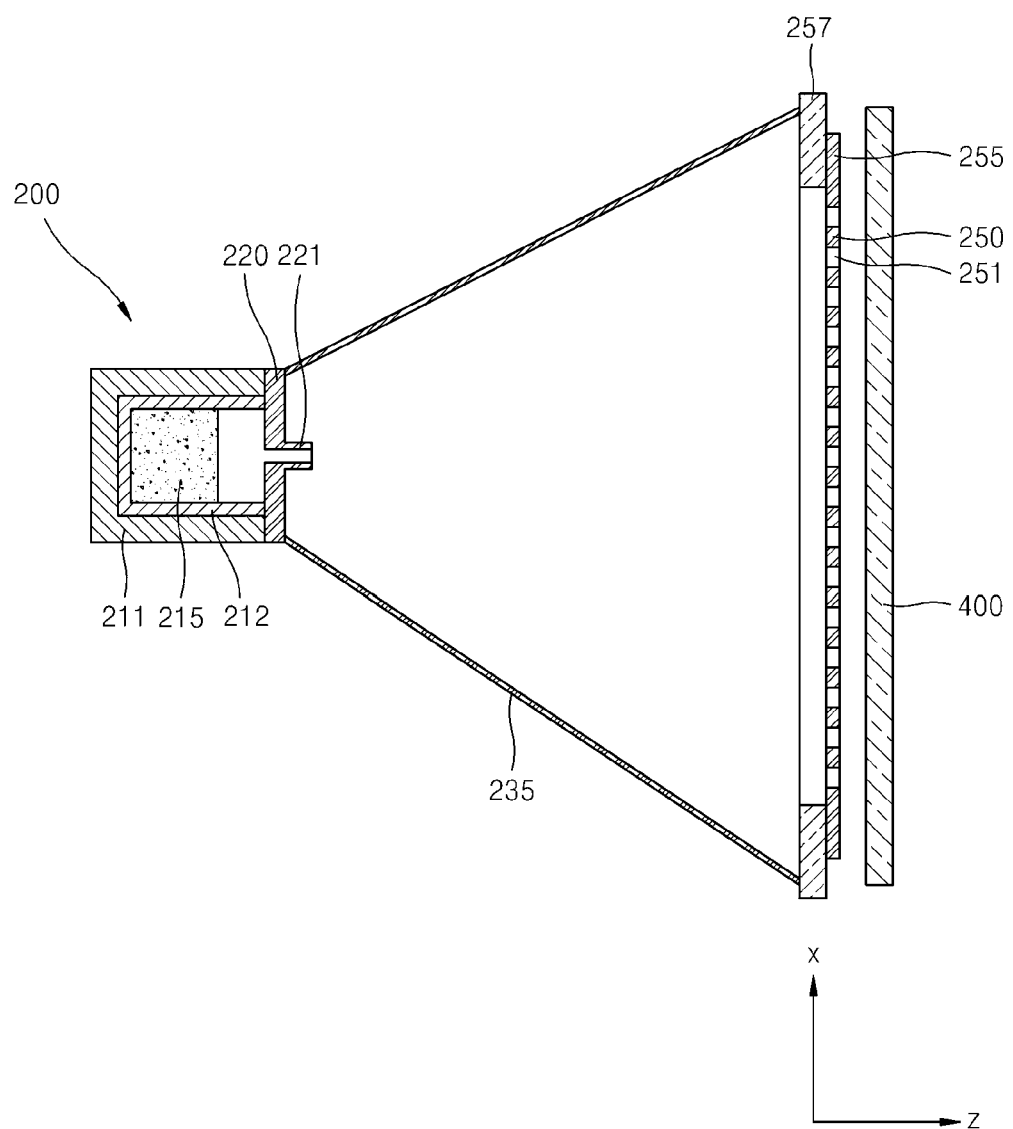
FIG. 14 is a schematic side view of the thin film deposition apparatus of FIG. 12, according to an embodiment of the present invention.

FIG. 12 is a schematic perspective view of a thin film deposition assembly 200 according to another embodiment of the present invention, FIG. 13 is a schematic sectional view of the thin film deposition assembly 200 illustrated in FIG. 12, and FIG. 14 is a schematic plan view of the thin film deposition assembly 200 illustrated in FIG. 12. For convenience of explanation, the present embodiment illustrated in FIGS. 12, 13, and 14 will now be described by focusing on differences between the previous embodiment and the present invention.

Referring to FIGS. 12 through 14, the thin film deposition assembly 200 includes a deposition source 210, a first nozzle 220, a second nozzle 250, and a second nozzle frame 255 in order to deposit a deposition material 215 on a substrate 400. According to other aspects of the present invention, the thin film deposition apparatus 200 may include additional and/or different components, such as in the examples described below.

Although a chamber is not illustrated in FIGS. 12 through 14 for convenience of explanation, all the components of the thin film deposition assembly 200 may be disposed within a chamber that is maintained at an appropriate degree of vacuum. The chamber is maintained at an appropriate vacuum in order to allow a deposition material to move in a substantially straight line through the thin film deposition apparatus 200.

In order to deposit the deposition material 215 emitted from the deposition source 210 and discharged through the first nozzle 220 and the second nozzle 250, on the substrate 400 in a desired pattern, the chamber should be maintained in a high-vacuum state as in a deposition method using an FMM. In addition, the temperature of the second nozzle 250 has to be sufficiently lower than the temperature of the deposition source 210. In this regard, the temperature of the second nozzle 250 may be about 100° C. or less. The temperature of the second nozzle 250 should be sufficiently low so as to reduce thermal expansion of the second nozzle 250.

The substrate 400, which is a deposition target, is disposed in the chamber. The substrate 400 may be a substrate for flat panel displays. A large substrate, such as a mother glass, for manufacturing a plurality of flat panel displays, may be used as the substrate 400. Other substrates may also be employed.

The deposition may be performed while the substrate 400 or the thin film deposition assembly 200 is moved relative to each other. In detail, deposition may be continuously performed while the substrate 400, which is disposed such as to face the thin film deposition assembly 200, is moved in a Y-axis direction. In other words, deposition is performed in a scanning manner while the substrate 400 is moved in a direction of arrow A in FIG. 12. Although the substrate 400 is illustrated as being moved in the Y-axis direction in FIG. 12 when deposition is performed, aspects of the present invention are not limited thereto. Deposition may be performed while the thin film deposition assembly 200 is moved in the Y-axis direction, whereas the substrate 400 is fixed.

Thus, in the thin film deposition apparatus 200, the second nozzle 250 may be significantly smaller than an FMM used in a conventional deposition method. In other words, in the thin film deposition assembly 200, deposition is performed continuously, (i.e., in a scanning manner while the substrate 400 is moved in the Y-axis direction). Thus, lengths of the second nozzle 250 in the X-axis and Y-axis directions may be significantly less than the lengths of the substrate 400 in the X-axis and Y-axis directions. As described above, since the second nozzle 250 may be formed to be significantly smaller than an FMM used in a conventional deposition method, it is relatively easy to manufacture the second nozzle 250. The use of the second nozzle 250, which is smaller than an FMM used in a conventional deposition method, is more convenient in all processes, including etching and subsequent other processes, such as precise extension, welding, moving, and cleaning processes, compared to the conventional deposition method using the larger FMM. This is more advantageous for relatively large display devices.

In order to perform deposition while the thin film deposition apparatus 200 or the substrate 400 is moved relative to each other as described above, the thin film deposition apparatus 200 and the substrate 400 may be separated from each other by a predetermined distance.

The deposition source 210 that contains and heats the deposition material 215 is disposed in an opposite side of the chamber to the side in which the substrate 400 is disposed. The deposition source 210 includes a crucible 211 for holding the deposition material 215, and a heater 212 for heating the crucible 211.

The first nozzle 220 is disposed at a side of the deposition source 210 facing the substrate 400. The first nozzle 220 includes a plurality of first slits 221 that may be arranged at equal intervals in the Y-axis direction, i.e., in the scanning direction of the substrate 400. The deposition material 215 that is vaporized in the deposition source 210 passes through the first nozzle 220 towards the substrate 400. As described above, when the plurality of first slits 221 are formed on the first nozzle 220 in the Y-axis direction, that is, the scanning direction of the substrate 400, a size of the pattern formed by the deposition material that is discharged through the second slits 221 of the second nozzle 250 is only affected by the size of one first slit 221, that is, it may be considered that only one first slit 221 exists in the X-axis direction, and thus there is no shadow zone on the substrate. In addition, since the plurality of first slits 221 are formed in the scanning direction of the substrate 400, even when there is a difference between fluxes of the first slits 221, the difference may be compensated and deposition uniformity may be maintained constantly.

The second nozzle 250 and the second nozzle frame 255 are disposed between the deposition source 210 and the substrate 400. The second nozzle frame 255 may be formed in a shape, similar to a window frame. The second nozzle 250 is bound inside the second nozzle frame 255. The second nozzle 250 includes a plurality of second slits 251 arranged in the X-axis direction. The deposition material 215 that is vaporized in the deposition source 210 passes through the first nozzle 220 and the second nozzle 250 towards the substrate 400.

The second nozzle 250 may be manufactured by etching, which is the same method as used in a conventional method of manufacturing an FMM, and in particular, a striped FMM. Here, the total number of second slits 251 may be greater than the total number of first slits 221.

The second nozzle frame 255 is formed in a shape such as a window frame having two approximately arched sides. The second nozzle frame 255 includes first frame portions 256 and second frame portions 257. In detail, the second nozzle frame 255 includes two first frame portions 256 extending in one direction (X direction) in parallel with each other. The second nozzle frame 255 also includes two second frame portions 257 each connecting the two first frame portions 256 to each other. The second frame portions 257 are curved in another direction (X direction) so as to have arched shapes. In other words, the second frame portions 257 form two convex sides of the second nozzle frame 255.

The structure of the second nozzle frame 255 of the thin film deposition apparatus 200 is the same as that illustrated in FIGS. 5 through 7B. Thus, a detailed description of the second nozzle frame 255 of the thin film deposition apparatus 200 will be omitted. A radiation fin as illustrated in FIG. 11 may be formed on the second nozzle frame 255. A thermal shield may be further disposed between the deposition source 210 and the second nozzle frame 255.

In addition, the deposition source 210 (and the first nozzle 220 coupled to the deposition source 210) and the second nozzle 250 may be formed to be separated from each other by a predetermined distance, and the deposition source 210 (and the first nozzle 220 coupled to the deposition source 210) and the second nozzle 250 may be connected by a connection member 235. That is, the deposition source 210, the first nozzle 220, and the second nozzle 250 may be formed integrally with each other by being connected to each other via the connection member 235. The connection member 235 may guide the deposition material 215, which is discharged through the first slits 221, to move straight, not to flow in the X-axis direction. In FIGS. 12 through 14, the connection members 235 are formed on only left and right sides of the deposition source 210, the first nozzle 220, and the second nozzle 250 to guide the deposition material 215 not to flow in the X-axis direction, however, aspects of the present invention are not limited thereto. That is, the connection member 235 may be formed as a sealed type box to guide both flows of the deposition material 215 in the X-axis and Y-axis directions.

As described above, the thin film deposition apparatus 200 performs deposition while being moved relative to the substrate 400. In order to move the thin film deposition apparatus 200 relative to the substrate 400, the second nozzle 250 is separated from the substrate 400 by a predetermined distance.

In a conventional deposition method using an FMM, deposition is performed with the FMM in close contact with a substrate in order to prevent formation of a shadow zone on the substrate. However, when the FMM is used in close contact with the substrate, the contact may cause defects. In addition, in the conventional deposition method, the size of the mask has to be the same as the size of the substrate since the mask cannot be moved relative to the substrate. Thus, the size of the mask has to be increased as display devices become larger. However, it is not easy to manufacture such a large mask.

In order to overcome this problem, in the thin film deposition apparatus 200, the second nozzle 250 is disposed to be separated from the substrate 400 by a predetermined distance.

As described above, according to an aspect of the present invention, a mask is formed to be smaller than a substrate, and deposition is performed while the mask is moved relative to the substrate. Thus, the mask can be easily manufactured. In addition, defects caused due to the contact between a substrate and a mask, which occurs in the conventional deposition method, may be prevented. Furthermore, since it is unnecessary to make the mask in close contact with the substrate during a deposition process, the manufacturing speed may be improved.

Figure 15:
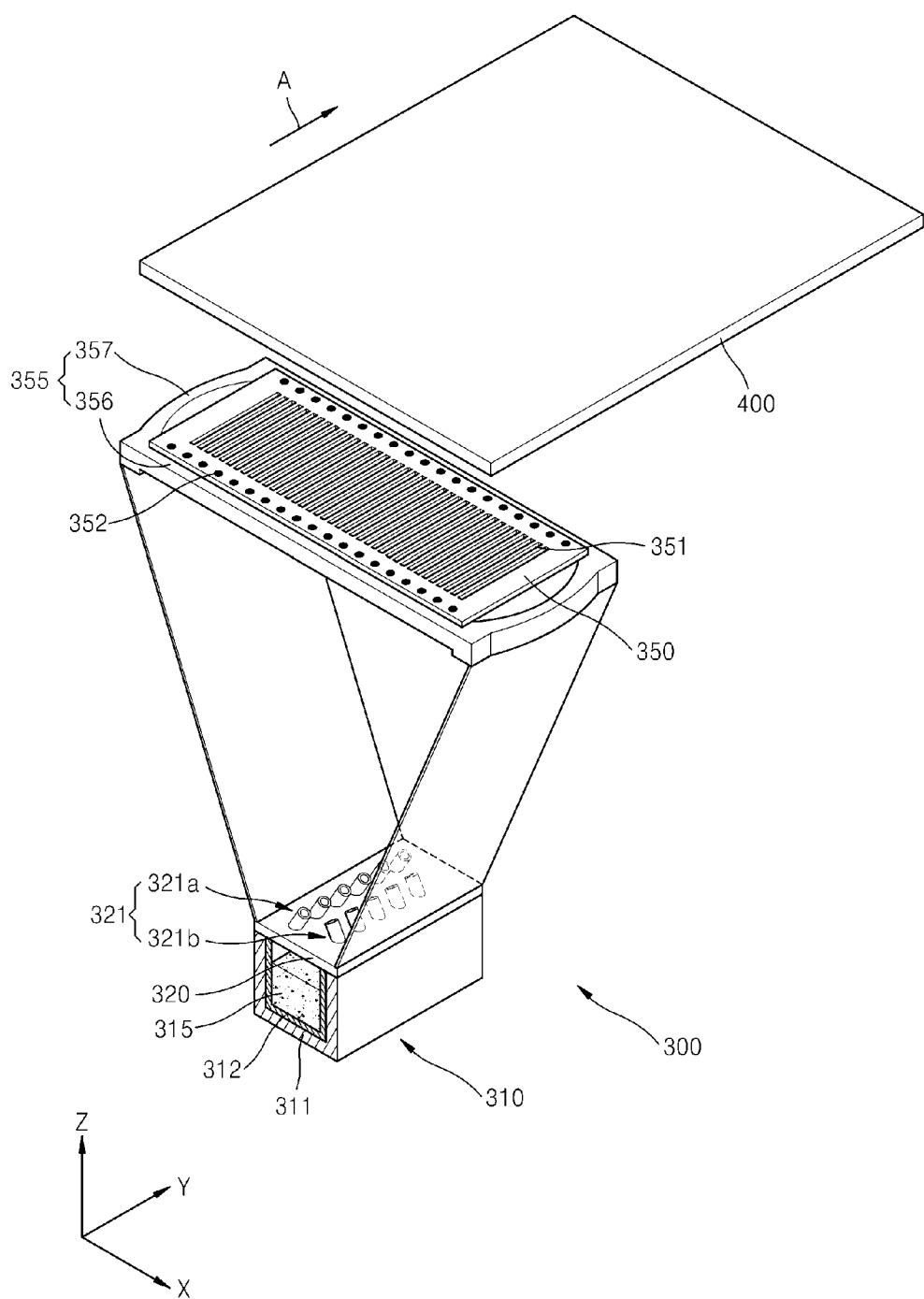
FIG. 15 is a schematic perspective view of a thin film deposition apparatus according to another embodiment of the present invention.

FIG. 15 is a schematic perspective view of a thin film deposition apparatus 300 according to another embodiment of the present invention. Referring to FIG. 15, the thin film deposition apparatus 300 includes a deposition source 310, a first nozzle 320, a second nozzle 350, and a second nozzle frame 355 in order to deposit a deposition material 315 on the substrate 400. According to other aspects of the present invention, the thin film deposition apparatus 300 may include additional and/or different components, such as in the examples described below. The deposition source 310 includes a crucible 311 to hold the deposition material 315, and a heater 312 to heat the crucible 311. The first nozzle 320 is disposed at a side of the deposition source 310, and includes a plurality of first slits 321 arranged in the Y-axis direction. The second nozzle 350 and the second nozzle frame 355 are further disposed between the deposition source 310 and the substrate 400, and the second nozzle 350 includes a plurality of second slits 351 arranged in the X-axis direction. In addition, the deposition source 310, the first nozzle 320, and the second nozzle 350 are connected to each other by a connection member 335.

The second nozzle 350 is supported by the second nozzle frame 355. The second nozzle frame 355 is formed in a shape such as a window frame having two approximately arched sides. The second nozzle frame 355 includes first frame portions 356 and second frame portions 357. In detail, the second nozzle frame 355 includes two first frame portions 356 extending in one direction (X direction) in parallel with each other. The second nozzle frame 355 also includes two second frame portions 357 each connecting the two first frame portions 356 to each other. The second frame portions 357 are curved in another direction (X direction) so as to have arched shapes. In other words, the second frame portions 357 form two convex sides of the second nozzle frame 355.

The structure of the second nozzle frame 355 of the thin film deposition apparatus 300 is the same as that illustrated in FIGS. 5 through 7B. Thus, a detailed description of the second nozzle frame 355 of the thin film deposition apparatus 300 will be omitted. A radiation fin as illustrated in FIG. 11 may be formed on the second nozzle frame 355. A thermal shield may be further disposed between the deposition source 310 and the second nozzle frame 355.

In the thin film deposition apparatus 300, the plurality of first slits 321 formed on the first nozzle 320 are tilted at a predetermined angle. In detail, the first slits 321 may include first slits 321a and 321b which are arranged in two rows, which are alternately arranged with each other. As shown, the first slits 321a and 321b are tilted at a predetermined angle on an X-Z plane.

Here, the first slits 321a in a first row are tilted toward the first slits 321b in a second row, and the first slits 321b in the second row are tilted toward the first slits 321a in the first row. That is, the first slits 321a arranged in the left row are arranged to face a right end of the second nozzle 350, and the first slits 321b arranged in the right row are arranged to face a left end of the second nozzle 350.

Figure 16:
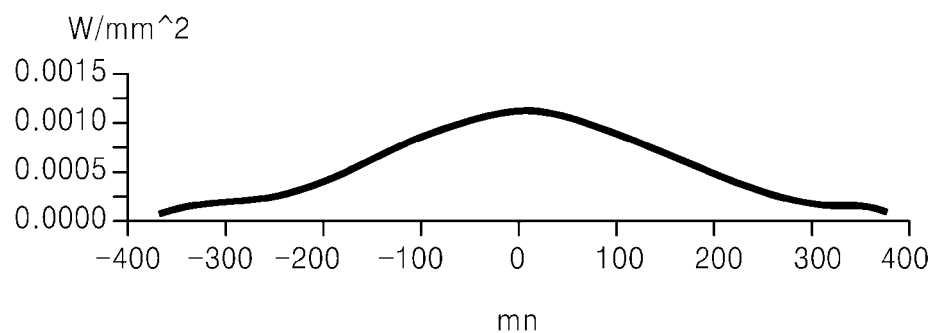
FIG. 16 is a graph schematically illustrating a distribution pattern of a deposition layer formed on a substrate when first slits are not tilted, in a thin film deposition apparatus according to an embodiment of the present invention.
Figure 17:
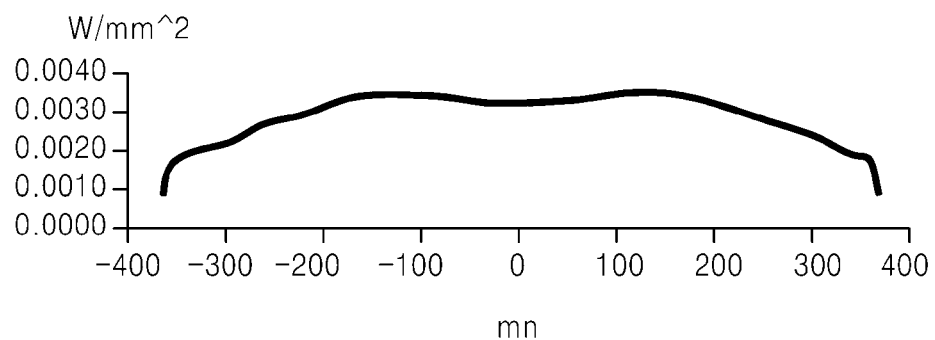
FIG. 17 is a graph schematically illustrating a distribution pattern of a deposition layer formed on a substrate when first slits are tilted, in a thin film deposition apparatus according to an embodiment of the present invention.

FIG. 16 is a graph showing a distribution of a deposition layer formed on a substrate when first slits are not tilted in a thin film deposition apparatus according to an embodiment of the present invention, and FIG. 17 is a graph showing a distribution of a deposition layer formed on a substrate when first slits are tilted in a thin film deposition apparatus according to an embodiment of the present invention. Comparing the graphs of FIGS. 16 and 17 with each other, a thickness of the deposition layer formed on both ends of the substrate when the first slits are tilted is relatively greater than a thickness of the deposition layer formed on both ends of the substrate when the first slits are not tilted, and thus, the uniformity of the deposition layer is improved.

Therefore, the deposition amount of the deposition material may be adjusted so that a difference between the thicknesses of the deposition layer at the center and ends of the substrate may be reduced and thus the entire thickness of the deposition layer may be constant, and moreover, the efficiency of utilizing the deposition material may be improved.

A thin film deposition apparatus according to an aspect of the present invention may form a precise pattern on a large substrate.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A thin film deposition apparatus comprising:
 a deposition source;
 a first nozzle disposed at a side of the deposition source and comprising a plurality of first slits;
 a second nozzle disposed opposite to the first nozzle and comprising a plurality of second slits; and
 a second nozzle frame bound to the second nozzle so as to support the second nozzle, the second nozzle frame comprising two first frame portions spaced apart from each other and disposed in a direction in which the plurality of second slits are arranged, and two second frame portions each connecting the two first frame portions to each other,
 wherein the second frame portions are curved in the direction in which the plurality of second slits are arranged, so as to form arches, and wherein the second nozzle is welded to the second nozzle frame.

2. The thin film deposition apparatus of claim 1, wherein each end of each of the second frame portions is connected to a corresponding one of the first frame portions.

3. The thin film deposition apparatus of claim 2, wherein thicknesses of the both ends of each of the second frame portions are greater than a thickness of a center of each of the second frame portions.

4. The thin film deposition apparatus of claim 1, wherein the two first frame portions are parallel with each other.

5. The thin film deposition apparatus of claim 1, wherein the second frame portions are convexly curved in a direction away from a center of the second nozzle frame.

6. The thin film deposition apparatus of claim 1, wherein each of the first frame portions comprises:
 a first surface disposed in a direction toward the second nozzle; and
 a second surface disposed in the direction toward the second nozzle and adjacent to the first surface,
 wherein the first surface is closer to the plurality of second slits of the second nozzle than the second surface, and
 wherein the first surface is flat and the second surface is sloped relative to the first surface.

7. The thin film deposition apparatus of claim 6, wherein the second surface is curved with respect to the first surface.

8. The thin film deposition apparatus of claim 6, wherein the second surface is sloped as not to coincide with an extension line of the first surface.

9. The thin film deposition apparatus of claim 6, wherein the second nozzle and the second nozzle frame are bound to each other using welding points formed on the second surface.

10. The thin film deposition apparatus of claim 6, wherein each of the first frame portions comprises:
 a third surface disposed in a direction away from the second nozzle; and
 a fourth surface disposed in the direction away from the second nozzle, to connect the third surface to the first surface, and
 wherein the third surface is flat and the fourth surface is sloped relative to the third surface.

11. The thin film deposition apparatus of claim 10, wherein the fourth surface forms an obtuse angle together with the third surface.

12. The thin film deposition apparatus of claim 6, wherein each of the first frame portions comprises:
 a third surface disposed in the direction away from the second nozzle, being adjacent to the second surface, and formed to be flat; and
 a fourth surface disposed in the direction away from the second nozzle, being adjacent to the third surface, and formed to have a step with respect to the third surface, and
 wherein the fourth surface is closer to the plurality of second slits of the second nozzle than the third surface.

13. The thin film deposition apparatus of claim 12, wherein the fourth surface is flat.

14. The thin film deposition apparatus of claim 1, further comprising a first barrier wall assembly including a plurality of first barrier walls to partition a space between the first nozzle and the second nozzle.

15. The thin film deposition apparatus of claim 14, wherein the first slits and the second slits are arranged in a first direction; and each of the plurality of first barrier walls extends in a second direction that is substantially perpendicular to the first direction, in order to partition the space between the first nozzle and the second nozzle.

16. The thin film deposition apparatus of claim 14, wherein at least one of the first slits is disposed between each two adjacent first barrier walls.

17. The thin film deposition apparatus of claim 14, wherein at least two of the second slits are disposed between each two adjacent first barrier walls.

18. The thin film deposition apparatus of claim 14, wherein a number of second slits disposed between each two adjacent first barrier walls is greater than a number of first slits disposed between each two adjacent first barrier walls.

19. The thin film deposition apparatus of claim 14, wherein the first barrier wall assembly is detachable from the thin film deposition apparatus.

20. The thin film deposition apparatus of claim 14, wherein the first barrier wall assembly is separated from the first nozzle.

21. The thin film deposition apparatus of claim 14, wherein the first barrier wall assembly further comprises a first cooling member.

22. The thin film deposition apparatus of claim 21, wherein the first cooling member includes a pipe through which coolant flows.

23. The thin film deposition apparatus of claim 14, further comprising a second barrier wall assembly disposed at a side of the first barrier wall assembly and including a plurality of second barrier walls.

24. The thin film deposition apparatus of claim 23, wherein the first slits and the second slits are arranged in a first direction; and
   each of the second barrier walls extends in a second direction that is substantially perpendicular to the first direction, in order to partition the space between the first nozzle and the second nozzle.

25. The thin film deposition apparatus of claim 23, wherein the first barrier walls are arranged to correspond to the second barrier walls.

26. The thin film deposition apparatus of claim 25, wherein each pair of the corresponding first and second barrier walls is arranged on substantially the same plane.

27. The thin film deposition apparatus of claim 23, wherein a calibration plate is installed between the first barrier wall assembly and the second barrier wall assembly.

28. The thin film deposition apparatus of claim 23, wherein thicknesses of the first barrier walls in a first direction are greater than thicknesses of the second barrier walls.

29. The thin film deposition apparatus of claim 23, wherein the first barrier walls and the second barrier walls are respectively arranged at equal intervals.

30. The thin film deposition apparatus of claim 23, wherein the first barrier walls are separated from the second barrier walls by a predetermined distance.

31. The thin film deposition apparatus of claim 23, wherein the second barrier walls are separated from the second nozzle by a predetermined distance.

32. The thin film deposition apparatus of claim 23, wherein the second barrier wall assembly further comprises a second cooling member.

33. The thin film deposition apparatus of claim 32, wherein the second cooling member includes a pipe through which coolant flows.

34. The thin film deposition apparatus of claim 1, wherein the plurality of first slits are formed in a first direction, the plurality of second slits are formed in a second direction perpendicular to the first direction, the thin film deposition apparatus performs deposition while moving relative to a deposition target in the first direction, and the deposition source, the first nozzle, and the second nozzle are integrally formed with one another.

35. The thin film deposition apparatus of claim 34, wherein the deposition source, the first nozzle, and the second nozzle are formed integrally with one another by being connected to each other via a connection member.

36. The thin film deposition apparatus of claim 35, wherein the connection member guides movement of a deposition material contained in the deposition source.

37. The thin film deposition apparatus of claim 35, wherein the connection member seals a space formed among the deposition source, the first nozzle, and the second nozzle.

38. The thin film deposition apparatus of claim 34, wherein a deposition material discharged from the thin film deposition apparatus is continuously deposited on the deposition target while the deposition target or the thin film deposition apparatus is moved relative to each other in the first direction.

39. The thin film deposition apparatus of claim 34, wherein the plurality of first slits are tilted at a predetermined angle.

40. The thin film deposition apparatus of claim 39, wherein the plurality of first slits include first slits arranged in two rows in the first direction, and the first slits in the two rows are tilted to face each other.

41. The thin film deposition apparatus of claim 39, wherein the plurality of first slits include the first slits arranged in two rows in the first direction, and the first slits arranged in one row face an end at a second side of the second nozzle,
   the first slits arranged in the other row face an end at a first side of the second nozzle.

42. The thin film deposition apparatus of claim 1, wherein the second nozzle is separated a predetermined distance from a deposition target on which a deposition material vaporized in the deposition source is deposited.

43. The thin film deposition apparatus of claim 42, wherein a width of the second nozzle in a direction is substantially equal to a width of the deposition target in a first direction.

44. The thin film deposition apparatus of claim 1, wherein a total number of the second slits is greater than a total number of the first slits.

45. The thin film deposition apparatus of claim 1, further comprising a radiation fin formed on the second nozzle frame.

46. The thin film deposition apparatus of claim 1, further comprising a thermal shield disposed between the deposition source and the second nozzle frame.

47. A thin film deposition apparatus comprising:
   a deposition source;
   a first nozzle disposed at a side of the deposition source and comprising a plurality of first slits;
   a second nozzle disposed opposite to the first nozzle and comprising a plurality of second slits; and
   a second nozzle frame bound to the second nozzle so as to support the second nozzle, and comprising parallel frame portions extending in a direction in which the plurality of second slits are arranged, and arching frame portions each arching frame portion disposed at respective ends of the parallel frame portions so as to impart a tensile force into the second nozzle via the frame portions, and
   wherein the second nozzle is welded to the second nozzle frame.

* * * * *